(12) United States Patent
Pan et al.

(10) Patent No.: US 9,246,103 B2
(45) Date of Patent: Jan. 26, 2016

(54) POLYMERS AND OLIGOMERS WITH FUNCTIONALIZED SIDE GROUPS

(75) Inventors: Junyou Pan, Frankfurt am Main (DE); Frank Egon Meyer, Kronberg (DE); Niels Schulte, Kelkheim (DE); René Peter Scheurich, Groβ-Zimmern (DE)

(73) Assignee: Merck Patent GmbH (DE)

( * ) Notice: Subject to any disclaimer, the term of this patent is extended or adjusted under 35 U.S.C. 154(b) by 0 days.

(21) Appl. No.: 14/234,825

(22) PCT Filed: Jun. 28, 2012

(86) PCT No.: PCT/EP2012/002713
§ 371 (c)(1),
(2), (4) Date: Jan. 24, 2014

(87) PCT Pub. No.: WO2013/013753
PCT Pub. Date: Jan. 31, 2013

(65) Prior Publication Data
US 2014/0175421 A1    Jun. 26, 2014

(30) Foreign Application Priority Data
Jul. 25, 2011   (EP) .................................... 11006097

(51) Int. Cl.
| C08G 73/06 | (2006.01) |
| H01L 51/00 | (2006.01) |
| C08G 73/18 | (2006.01) |
| H01L 51/50 | (2006.01) |

(52) U.S. Cl.
CPC ........ *H01L 51/0043* (2013.01); *H01L 51/0035* (2013.01); *H01L 51/0039* (2013.01); *H01L 51/5012* (2013.01); *Y02E 10/549* (2013.01)

(58) Field of Classification Search
CPC .............................. H01L 51/00; C08G 73/06
USPC ................... 257/40; 528/70, 80, 423
See application file for complete search history.

(56) References Cited

U.S. PATENT DOCUMENTS

| 6,963,005 | B2 | 11/2005 | Lecloux et al. |
| 7,683,183 | B2 | 3/2010 | Peters et al. |
| 2002/0048689 | A1 | 4/2002 | Igarashi et al. |
| 2005/0244672 | A1 | 11/2005 | Che et al. |
| 2007/0111026 | A1 | 5/2007 | Deaton et al. |
| 2007/0265473 | A1 | 11/2007 | Becker et al. |
| 2008/0036370 | A1 | 2/2008 | Noh et al. |
| 2010/0026174 | A1 | 2/2010 | Igarashi et al. |
| 2010/0227974 | A1 | 9/2010 | Schulte et al. |
| 2011/0108769 | A1 | 5/2011 | Yersin et al. |
| 2011/0144366 | A1 | 6/2011 | Stoessel et al. |
| 2011/0155954 | A1 | 6/2011 | Yersin et al. |

FOREIGN PATENT DOCUMENTS

| CN | 101747375 A | 6/2010 |
| DE | 102008033563 A1 | 1/2010 |
| EP | 1424350 | 6/2004 |
| JP | 2003212886 A | 7/2003 |
| WO | WO-2004/041901 | 5/2004 |
| WO | WO-2005/118606 A1 | 12/2005 |
| WO | WO-2008/019744 A1 | 2/2008 |
| WO | WO-2010006681 A1 | 1/2010 |
| WO | WO-2011063083 A1 | 5/2011 |

OTHER PUBLICATIONS

Li et al. Synthesis and electroluminescent properties of a polyfluorenes grafted oligo(phenylenevinylene derivative with two triphenylamine side group); 2010; Gaofenzi Xuebao (2010, (5), 501-507; Chem Abstract 153: 287693.*

Cheng, Yi-Ming, et al., "Rational Design of Chelating Phosphine Functionalized Ost$^{(II)}$ Emitters and Fabrication of Orange Polymer Light-Emitting Diodes Using Solution Process", Adv. Funct. Mater., vol. 18, (2008), pp. 83-194.

Deaton, Joseph C., et al., "E-Type Delayed Fluorescence of a Phosphine-Supported $Cu_2(\mu-NAr_2)_2$ Diamond Core: Harvesting Singlet and Triplet Excitons in OLEDsII", J. Am. Chem. Soc., vol. 132, (2010), pp. 9499-9508.

Kui, Steven C.F., et al., "Platinum(II) Complexes with □-Conjugated, Naphthyl-Substituted, Cyclometalated Ligands (RC□N□N): Structures and Photo- and Electroluminescence", Chem. Eur. J., vol. 13, (2007), pp. 417-435.

Miller, Alexander J.M., et al., "Long-Lived and Efficient Emission from Mononuclear Amidophosphine Complexes of Copper", Inorganic Chemistry, vol. 46, No. 18, (2007), pp. 7244-7246.

Moudam, Omar, et al., "Electrophosphorescent Homo- and Heteroleptic Copper(I) Complexes Prepared from Various Bis-Phosphine Ligands", Chem. Commun., (2007), pp. 3077-3079.

International Search Report for PCT/EP2012/002713 mailed Mar. 19, 2013.

U.S. Appl. No. 14/234,720, filed Jan. 24, 2014, Pan et al.

* cited by examiner

*Primary Examiner* — Duc Truong

(74) *Attorney, Agent, or Firm* — Drinker Biddle & Reath LLP

(57) ABSTRACT

The present invention relates inter alia to oligomers and/or polymers with functionalized side groups which are bound to the backbone of the polymer via spacer.

21 Claims, No Drawings

POLYMERS AND OLIGOMERS WITH FUNCTIONALIZED SIDE GROUPS

CROSS-REFERENCE TO RELATED APPLICATIONS

This application is a national stage application (under 35 U.S.C. §371) of PCT/EP2012/002713, filed Jun. 28, 2012, which claims benefit of European application 11006097.7, filed Jul. 25, 2011.

The invention relates to novel compounds containing one or more opto-electronic functional side group(s). The invention further relates to the use of these compounds in electronic and electrooptical devices, in particular in organic light emitting devices (OLEDs). The invention further relates to OLEDs containing at least one compound of this invention.

By using a compound of the present invention containing an opto-electronic functional side-chain, which is bonded to the backbone through a spacer, it is possible to achieve an OLED with good performance, e.g. long lifetime, high (power) efficiency and low driving voltage, while keeping excellent solubility.

OLEDs have drawn much attention due to their potential application in next generation panel displays. Generally speaking, there are two classes of materials for OLEDs.

The first class consists of small molecules (SMOLEDs), which are usually deposited by thermal vacuum evaporation. Multilayer device structures can be deposited, whereby the optimisation on individual functional layers, for example hole injection layer (HIL), hole transport layer (HTL), emissive layer (EML) and electron transport layer (ETL) can be made for an optimal overall performance.

The second class are the polymers (PLEDs), which can be processed from solution. An advantage of PLEDs is that large area panel displays may be made using printing technologies, for example inkjet printing. Unlike SMOLEDs, the typical PLEDs device consists of a single active layer, where hole transport, electron transport and emissive layer are combined into one layer, thus putting a very strict requirement on the active layer. Though significant improvement has been made in the last years, the performance of the PLEDs, especially concerning the lifetime (in particular for blue PLEDs) and driving voltage still needs further improvement in order to be commercially successful. Single layer PLEDs often show poor lifetime. WO 2004/084260 discloses a PLED wherein an interlayer between the hole injection layer (HIL) and the light emitting polymer (LEP) is reported to improve the lifetime compared to conventional single layer PLEDs.

Still, the EML in interlayer PLEDs needs desired emission, electron transport and good solubility. In order to obtain sufficient solubility, the polymer is usually substituted with a long flexible side-chain, typically alkyl or alkyloxy. These long side-chain groups are useful only for solubility, thus film formation. After the film formation, they don't have any contribution to opto-electronic performance of the device. Moreover, they reduce the volume of the active materials. This has consequences on the device performance, especially lifetime and driving voltage.

For conjugated polymers, important characteristics are the binding energies, which are measured with respect to the vacuum level of the electronic energy levels, especially the "highest occupied molecular orbital" (HOMO), and "lowest unoccupied molecular orbital" (LUMO) levels. These can be measured by photoemission, e.g. XPS (X-ray photoelectron spectroscopy) and UPS (Ultra-violet photoelectron spectroscopy) or by cyclic voltammetry (hereinafter referred to as CV) for oxidation and reduction.

It is well understood that the absolute energy levels are dependent of the method used, and even the evaluation of the same method, for example the onset point and peak point on the CV curve give different values. Therefore, for a reasonable comparison it is crucial to take advantage of the same method.

More recently, quantum chemistry methods, for example Density Function Theory (hereinafter referred to as DFT) or Austin Model 1 (hereinafter referred to as AM1), have become well-established to calculate molecular orbital, particularly occupied molecular orbitals; and especially HOMO (highest occupied molecular orbital) levels can be well estimated by this method. Therefore, with the help of DFT or AM1, given by commercially available software like for example "Gaussian 03W" (Gaussian, Inc.), the HOMO/LUMO of the different units in the conjugated polymers can be calculated.

US 2006/217527 describes an electroluminescent conjugated polymer containing a side chain with a phosphorescent organometallic complex (such as iridium, platinum, osmium, rubidium, etc.), which is further covalently bound to the backbone of the polymer through a spacer. The conjugated polymer may further comprise another side-chain containing a charge transport unit.

In WO 2004/113468 a blend is described containing at least one carbazole dimer, where two carbazole molecules are bound through a spacer.

WO 2006/137434 describes a fluorene-based luminescent or charge-transporting polymer which has a functional side chain containing at least one functional group selected from the group consisting of a hole-injection group and a transporting group containing one or more heteroatoms other than nitrogen or two or more nitrogen atoms, an electron-injection group and a transporting group containing one or more heteroatoms other than nitrogen or two or more nitrogen atoms, and a luminescent group containing a fused aromatic hydrocarbon or heterocycle, characterized in that the functional group is directly bonded to the saturated carbon atom of the fluorenediyl group or is bonded to the fluorenediyl group through —$R^k$—X— (wherein $R^k$ represents alkylene and X represents a direct bond or connecting group).

In WO 2006/137436 a luminescent or charge-transporting polymer compound having a main chain is described containing a divalent heterocyclic group, a divalent condensed polycyclic hydrocarbon group not including a five-membered ring, a group represented by the formula below or a divalent aromatic amine group as a repeating unit, and a side chain containing at least one functional group selected from the group consisting of hole injecting groups and of transporting groups, electron injecting groups, transporting groups and light-emitting groups. This polymer compound is characterized in that the functional group is directly bonded to a saturated carbon atom in the repeating unit or bonded to the repeating unit via X in an —$R^J$—X— group, wherein $R^J$ represents an optionally substituted alkylene group, X represents a direct bond, an oxygen atom, a sulfur atom, C=O, C(=O)—O, S=O, $SiR^8R^9$, $NR^{10}$, $BR^{11}$, $PR^{12}$ or P(=O) $R^{13}$. In the formula, the ring A and the ring B independently represent an optionally substituted aromatic hydrocarbon ring, and the aromatic hydrocarbon ring in the ring A and the aromatic hydrocarbon ring in the ring B have different ring structures from each other; two bonding hands are respectively present on the ring A and/or the ring B; $R^w$ and $R^x$ independently from each other represent a hydrogen atom or a substituent, and $R^w$ and $R^x$ may combine to form a ring.

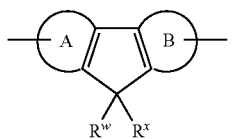

Formula (1)

Bao et al. reported in Optical Materials 1999, 12, 177 a hybrid light emitting polymer having oxadiazole as side-chain attached, with or without an oxygen spacer to a PPV based backbone. Wu et al. reported in J. Polymer Sci. Vol 2006, 44, 6765 that a series of polyfluorene-phenylenes containing various dendritic oxadiazole (OXD) pendent wedges, were synthesized by the Suzuki polycondensation of OXD-functionalized 1,4-dibromophenylene with 9,9-dihexylfluorene-2,7-diboronic ester. Wu et al., as reported in J. Mater. Chem. 2007, 17, 167, developed an efficient green-emitting polymer (FTO-BT5) through the incorporation of low-bandgap 2,1,3-benzothiadiazole (BT) moieties into the backbone of a blue-light-emitting polyfluorene copolymer (PF-TPA-OXD), which contains hole-transporting triphenylamine (TPA) and electron-transporting oxadiazole (OXD) pendent groups. No spacer was used between the functional side groups and the polymer backbone. In Polymer 46 (2005) 12158-12165, Youngeup Jin et al. reported electroluminescent polyfluorene-based conjugated polymers containing oxadiazole and carbazole units as pendants. The functional side-chains are attached to the fluorene units on the backbone through a spacer —$(CH_2)_6$—.

All of the polymers disclosed above are only focused on partially functionalised side-chain, yet use insulating group as the majority of side-chain, or failed to point out the effective way to reduce the insulating part yet maintaining the good solubility.

It was now surprisingly found that by using polymers with opto-electronic functionalized side-chains, which are bound to any repeat unit of the backbone through a spacer, PLEDs, with or without interlayer, could be built, with long lifetime, low driving voltage and at the same time excellent solubility, thus achieving good processability. Also, it was found that other compounds, small molecules and oligomers according to the present invention show improved performance and good wet processability, which could not be expected in view of the prior art.

Opto-electronic functional groups refer to the groups in an aromatic or heteroaromatic system, which have one or more of the following properties: hole transport, hole blocking, hole injection, electron injection, electron transport, electron blocking, emission, exciton formation, exciton transport, hole trapping, electron trapping, exciton blocking, singlet exciton sensitizer or light absorbing properties.

"Hole injection property" refers to a material or unit capable of accepting holes (i.e. positive charges) from an anode under application of a positive voltage. Usually the said material or unit has a HOMO higher than or comparable to the work function of the said anode.

"Hole transport property" refers to a material or unit capable of transporting holes (i.e. positive charges) injected from a hole injecting material or an anode.

"Electron injection property" refers to a material or unit capable of accepting electrons (i.e. negative charges) from a cathode under applying a negative voltage. Usually the said material or unit has a LUMO lower than or comparable to the work function of the said cathode.

"Electron transport property" refers to a material or unit capable of transporting electrons (i.e. negative charges) injected from an electron injecting material or a cathode.

"Exciton formation property" refers to a material or unit, wherein holes and electrons can recombine to form an exciton, or which can form an exciton by optical excitation, for example by absorbing one photon, in this case a light absorber.

"Emission property" refers to a material or unit which, upon receiving excitonic energy by energy transfer from other units, or by forming an exciton either electrically or optically, undergoes radiative decay to emit light.

"Hole trapping property" refers to a material or unit having a higher-lying HOMO than the surrounding matrix or backbone, so that the dwelling time of holes on this unit is much longer than on other units.

"Electron trapping property" refers to a material or unit having a lower-lying LUMO than the surrounding matrix or backbone, so that the dwelling time of electrons on this unit is much longer than on other units.

"Electron blocking property" refers to a material or unit which, if coated adjacent to an electron transporting layer in a multilayer structure or an electron transporting segment in a copolymer, prevents the electron flowing through. Usually it has a higher LUMO than that in the adjacent electron transport unit.

"Hole blocking property" refers to a material or unit which, if coated adjacent to a hole transport layer in a multilayer structure or a hole transporting segment in a copolymer, prevents the hole flowing through. Usually it has a deeper HOMO than the adjacent hole transport unit.

"Singlet exciton sensitizer" refers to a material or unit which is able to transfer the triplet exciton into the singlet exciton on a singlet emitter through energy transfer, for example Förster transfer; it is usually a phosphorescent emitter, as reported by M. A. Baldo, et al., Nature 2000, 403, 705.

"Exciton blocking property" refers to a material or unit which, if coated adjacent to exciton formation layer in a multilayer structure or an exciton formation segment in a copolymer, prevents the exciton flowing through. Usually it has a much bigger energy gap than the adjacent exciton formation unit.

An "interlayer" as referred to hereinafter means a layer in an OLED device that is situated either between the hole injection layer (HIL) and the emissive layer (EML), or between the electron injection layer (EIL) and the EML, and is intended to prevent electrons from flowing into the HIL, or holes from flowing into the EIL, respectively. An interlayer for use between the HIL and the EML should usually contain a material having hole transport and electron blocking properties, and an interlayer for use between the EIL and the EML should contain a material having electron transport and hole blocking properties.

The term "oligmer" refers to a compound, in contrast to a polymer, consists of a finite number of monomer units, for example 6 repeating units.

The term "polymer" includes homopolymers and copolymers, e.g. statistical, alternating or block copolymers.

The term "conjugated polymer or oligomer" means a polymer or oligomer containing in its backbone (or main chain) mainly C atoms with $sp^2$-hybridisation (or optionally also sp-hybridisation), which may also be replaced by hetero atoms. In the simplest case this is for example a backbone with alternating C—C single and double (or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer or oligomer. Also included in this meaning are polymers or oligomers wherein the backbone comprises for example units like aryl amines, aryl phosphines and/or certain heterocycles (i.e. conjugation via N-, O-, P- or S-atoms) and/or metal organic complexes (i.e. conjugation via a metal atom).

The term "spacer" means a unit or block A, which is intentionally integrated in a polymer or oligomer backbone to break the conjugation, usually in the form of P1-A-P2, where P1 and P2 are conjugated segments. Through the conjugation breaker A, P1 and P2 are electronically decoupled from each other, i.e., they could virtually be seen as 2 molecules. From the viewpoint of a molecular orbital, there is no delocalization from P1(P2) through A to P2 (P1), especially for HOMO and LUMO orbitals. Therefore quantum simulations are considered to be a good tool to investigate the spacer. Usually a spacer is selected from saturated substituted alkyl, alkylidene or alkylalkylen alkylsilyl, silyl, alkyloxyalkyl or alkylthioalkyl. However some aromatic systems, which introduce a big torsion angle in the chain, could be seen as a spacer, for example binaphthyl and its derivatives.

"Backbone group", unless stated otherwise, means the group/groups that has/have the highest content of all groups present in a polymer or oligomer, preferably with a ratio larger than or equal to 20%, very preferably larger than or equal to 30%, in particular larger than or equal to 40%, most preferably larger than or equal to 50%. Backbone groups can also form electron transporting units, hole transporting units, exciton formation units or emissive units either alone or in combination with other groups. For example, if there are two groups whose contents are clearly higher than those of the other groups present in the polymer, or if there are only two groups present in a polymer, then both groups are considered as backbone groups. Preferably the backbone groups are hole transporting groups or electron transporting groups.

The term "unit" in a polymer or oligomer according to the present invention means a repeating unit in a polymer or oligomer, which may consist of a single monomeric group or may also be formed by two or more monomeric groups. For example, an emissive unit may be formed by an emitter group $A^{em}$ and two backbone groups B and is then given by the formula $B-A^{em}-B$. Unless stated otherwise, the quantum chemistry simulation is carried out on units of this formula.

The applicants established a very consistent combination method to determine the energy levels of organic materials. The HOMO/LUMO levels of a set of materials (for example more than 20 different materials) are measured by CV and also calculated by the Gaussian 03W using AM1, or DFT with the same correction functional, for example B3PW91 and the same basis set, for example 6-31G(d). The calculated values are then calibrated according to the measured values. Such calibration factor is used for further calculation. The calculations performed by DFT and AM1 and the measurements were found to be highly correlated. This gives a sound basis for the estimation and comparison of the energy levels by simulation. In doing so, the applicants found that for most of the groups that are equal to or larger than biphenyl, the simulation on the above-mentioned triads, like for example —B-$A^h$-B—, gives very reliable results.

For determination of energy gaps or bandgaps, the energy levels like the HOMO of different units should be measured or calculated with the same method. The preferred methods used in this invention are the calibrated DFT and AM1 methods and CV measurement. The calibrated AM1 method is particularly preferred for big molecules.

It should also be pointed out that the HOMO of the entire conjugated polymer or oligomer is determined by the highest HOMO of its different units, and the LUMO of the entire conjugated polymer or oligomer is determined by the lowest LUMO of its different units.

The present invention relates to a compound comprising units of Formula (2).

Formula (2)

where n is larger than or equal to 1, A is a spacer that is not N-substituted, preferably saturated or unsaturated substituted alkyl, alkylsilyl, silyl, alkyloxyalkyl or alkylthioalkyl with 1 to 12 C atoms, wherein the substitution pattern is hydrogen, halogen (F, Cl, Br or I), alkyl, heteroalkyl or cycloalkyl; $Ar^2$ is an opto-electronic functional group selected from a hole injection, a hole transport group, an electron injection, an electron transport or an electron blocking group, a backbone or host group, a photon absorber group, or an emissive group, with the proviso that $Ar^2$ is not oxidiazole or a derivative of oxidiazole, and that $Ar^2$ is not a phosphorescent organometallic complex; $Ar^1$ is selected from optionally substituted monocyclic, bicyclic or polycyclic aromatic or heteroaromatic groups, with the proviso that $Ar^1$ is not fluorene or a linear olefin moiety.

The flexible spacer A helps increasing the solubility, and to separate the conjugation between the functional group $Ar^2$ and $Ar^1$ the polymer (or oligomer) backbone or another function group in the case of small molecule.

In an OLED device according to the present invention it is desired, and therefore preferred, to increase the content of the active components, mainly the conjugated part, as high as possible in one or more different functional layers, for example hole transport layer, electron transport layer and emissive layer, yet maintain the good solubility of the compound so that the layer can be coated from a solution of the said compounds. In other words, the insulating parts, mainly the long alkyl or alkyloxy side-chain, which is usually used to enable the good solubility of the conjugated polymers or oligomers, should be reduced at no cost of the solubility of the polymers or oligomers. This can be realised by at least partially replacing the insulating side-chain by the side chain of Formula (3).

Formula (3)

where A is a spacer that is not N-substituted, preferably saturated substituted alkyl or alkylsilyl, or silyl, alkyloxyalkyl or alkylthioalkyl with 1 to 12 C atoms, preferably having at least 2 adjacent single bonds along the main chain of A, wherein the substitution pattern can be H, halogen, heteroalkyl, alkyl, cycloalkyl, and $Ar^2$ is an opto-electronic functional group selected from hole injection/transport/blocking group, electron injection transport/blocking group, backbone group, photon absorber group, exciton formation group, singlet exciton sensitizer, and emissive group.

The units in a polymer or an oligomer of this invention are preferably of the formula —B-$A^x$-B with at least one side chain of Formula (3) on B or $A^x$, wherein the groups B denote independently of one another identical or different backbone groups, preferably the same backbone group, and $A^x$ is a group selected from groups having hole transporting property ($A^h$), hole injection property ($A^{hi}$), hole trapping property ($A^{hp}$), hole blocking property ($A^{hb}$), electron transport property ($A^e$), electron injection property ($A^{ei}$), electron blocking property ($A^{eb}$), exciton formation property ($A^{ex}$), exciton blocking property ($A^{exb}$), emissive property ($A^{em}$), singlet exciton sensitizer ($A^{ss}$).

Thus, polymers or oligomers of this invention preferably comprise one or more hole transporting units of formula —B-$A^h$-B—, wherein $A^h$ is a group having hole transport property, one or more electron transporting units of formula —B-$A^e$-B—, wherein $A^e$ is a group having electron transport property, and one or more exciton formation units of formula —B-$A^{ex}$-B—, wherein $A^{ex}$ is a group having exciton formation property, one or more emissive units of formula —B-$A^{em}$-B—, wherein $A^{em}$ is a group having emission property, with at least one side chain of Formula (3) on B or $A^h$ or $A^e$ or $A^{ex}$ or $A^{em}$.

Preference is given to polymer or oligomer of the present invention comprising a conjugated electron transporting main chain, and at least one ETM on side chain. Further preferably, the said side chain ETM has a LUMO, whose difference to the LUMO of the main chain is less than 0.2 eV, particularly preferably less then 0.1 eV, very particularly preferably less than 0.05 eV. The polymer or oligomer has preferably a general Formulae (4) or (5), wherein $Ar^2$ is an ETM, and x may be in the range from 0.01 to 0.9, preferably in the range from 0.1 to 0.5, particularly preferably in the range from 0.15 to 0.4, and very particularly preferably in the range from 0.15 to 0.3. The polymer or oligomer according to this preferred embodiment may be particularly suitable as electron transport material in organic electronic devices.

The compounds according to the present invention containing the opto-electronic functional side-group of Formula (2) are preferably in the following forms:
1) oligomer:

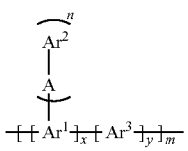

Formula (4)

where $x+y=1.0$, $x>0$ and $y\geq 0$, and $1<m\leq 6$.

2) polymer:

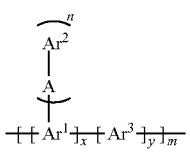

Formula (5)

where $x+y=1.0$, $x>0$ and $y\geq 0$, and $m>6$.

Where A and $Ar^2$ are the same as above, $Ar^3$ which may be the same or different, denote, independently if in different repeat units, an optionally substituted mononuclear or polynuclear aryl group, which may be optionally substituted by a bridging group linking different chain residues of Formulae (4) or (5).

Typically, x in any form of Formula (4) and (5) is larger than or equal to 10 vol %, very preferably is larger than or equal to 20 vol %, most preferably is larger than or equal to 30 vol %.

Preferably n in any form of Formulae (4) and (5) is larger than or equal to 2, very preferably n is 1.

The molecular weight $M_W$ of oligomer of Formula (4) is preferably 1500 to 10000 g/mol.

The weight average molecular weight $M_W$ of polymer of Formula (5) is preferably from 10,000 to 900,000 g/mol, very preferably from 50,000 to 500,000 g/mol, most preferably from 200,000 to 400,000 g/mol.

In addition to the compounds of Formulae (4) and (5), the compounds can be dendrimers, which comprise the side-chain of Formula (3) in their shell.

Preferably the units $Ar^1$, $Ar^2$, and $Ar^3$, independently if in different repeating units, are selected from groups $A^x$ and B as defined above selected from phenylene, biphenylene, napthalene, anthracene, phenanthrene, dihydrophenanthrene, fluorene, bifluorene, spirobifluorene, phenylene-vinylene, carbazole, pyrene, perylene, 9,10-dihydrophenanthrene, fused thiophene, like thieno[2,3b]thiophene or thieno[3,2b] thiophene, dithienothiophene, dibenzo-thiophene, phenanthroline, trans-indenofluorene, cis-indenofluorene, dibenzo-indenofluorene, indenonaphthalene, triarylamine, binaphthylene, benzenefluorene, benzanthrene, or derivatives thereof.

Preferred backbone groups B are those of Formula (6) (cis- or trans-indenofluorene derivatives)

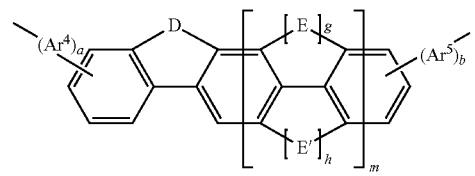

Formula (6)

wherein

D, E and E' are independently of each other, and in case of multiple occurrence independently of one another, a divalent group, preferably selected from —$CR^1R^2$—, —$NR^1$—, —$PR^1$—, —O—, —S—, —SO—, —$SO_2$—, —CO—, —CS—, —CSe—, —P(=O)$R^1$—, —P(=S)$R^1$— and —$SiR^1R^2$—, $R^1$ and $R^2$ are independently of each other identical or different groups selected from H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally contains one or more hetero atoms, and optionally the groups $R^1$ and $R^2$ form a spiro group with the fluorene moiety to which they are attached, X is halogen, $R^0$ and $R^{00}$ are independently of each other H or an optionally substituted carbyl or hydrocarbyl group optionally containing one or more hetero atoms, each g is independently 0 or 1 and each corresponding h in the same subunit is the other of 0 or 1, m is an integer $\geq 1$, $Ar^4$ and $Ar^5$ are independently of each other mono- or poly-nuclear aryl or heteroaryl that is optionally substituted and optionally fused to the 7,8-positions or 8,9-positions of the indenofluorene group, a and b are independently of each other 0 or 1, If the groups R¹ and R² form a spiro group with the fluorene group to which they are attached, it is preferably spirobifluorene.

In Formula (6) the term 'subunit' means the group

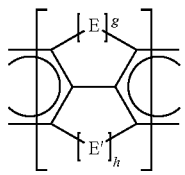

Accordingly, a subunit in Formula (6) wherein g is 1 and h is 0 is of structure (7), and a subunit wherein g is 0 and h is 1 is of structure (8):

Formula (7)

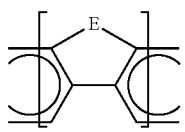

Formula (8)

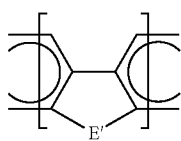

The groups of Formula (6) are preferably selected from the following Formulae (9) to (13).

Formula (9)

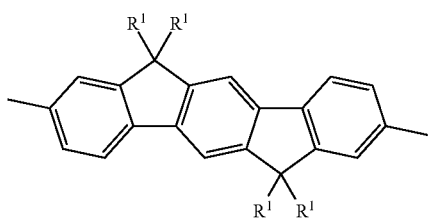

Formula (10)

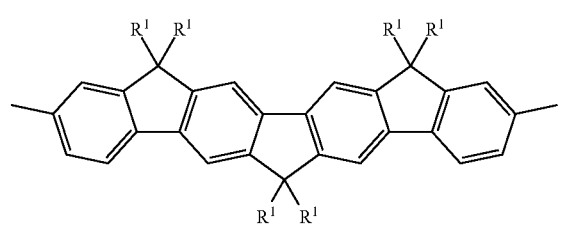

Formula (11)

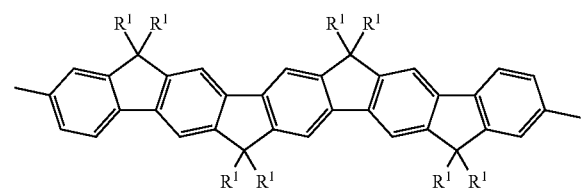

Formula (12)

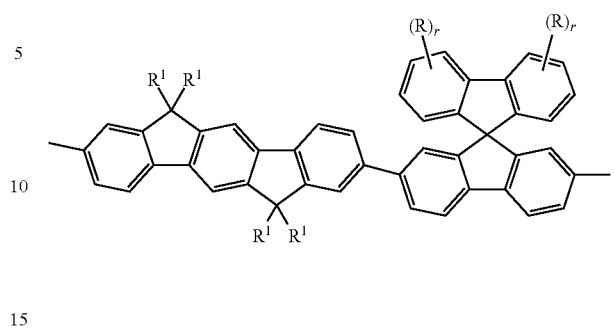

Formula (13)

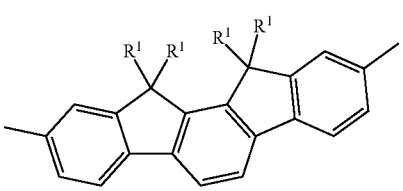

wherein R¹ is as defined in Formula (6), r is 0, 1, 2, 3 or 4, and R has one of the meanings of R¹.

R is preferably F, Cl, Br, I, —CN, —NO₂, —NCO, —NCS, —OCN, —SCN, —C(=O)NR°R°°, —C(=O)X, —C(=O)R°, —NR°R°°, optionally substituted silyl, aryl or heteroaryl with 4 to 40, preferably 6 to 20 C atoms, or straight chain, branched or cyclic alkyl, alkoxy, alkylcarbonyl, alkoxycarbonyl, alkylcarbonyloxy or alkoxycarbonyloxy with 1 to 20, preferably 1 to 12 C atoms, wherein one or more H atoms are optionally replaced by F or Cl, and wherein R°, R°° and X are as defined above in Formula (6).

Preferred groups of Formula (6) are selected from the following Formulae (14) to (17):

Formula (14)

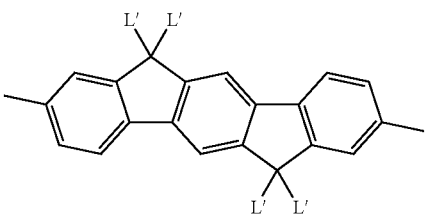

Formula (15)

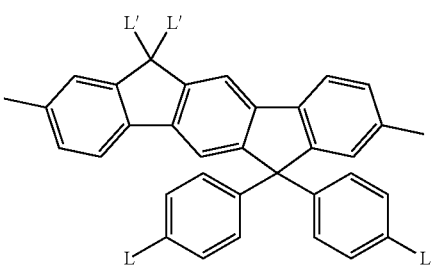

-continued

Formula (16)

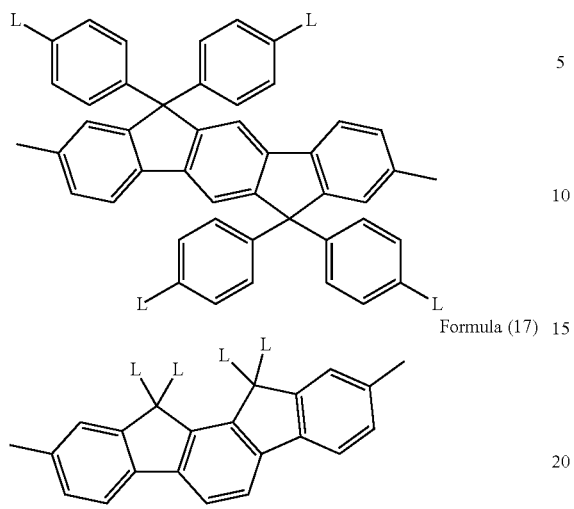

Formula (17)

wherein

L is selected from H, halogen or optionally fluorinated, linear or branched alkyl or alkoxy with 1 to 12 C atoms, and is preferably H, F, methyl, i-propyl, t-butyl, n-pentoxy, or trifluoromethyl, and L' is optionally fluorinated, linear or branched alkyl or alkoxy with 1 to 12 C atoms, and is preferably n-octyl or n-octyloxy.

The groups of Formula (6) are also suitable as electron transporting groups $A^e$ when used with other groups with low LUMO, especially preferably those of Formula (9), very preferably those of Formula (15).

Further preferred backbone groups B are those of Formula (18) (phenanthrene derivatives), as disclosed for example in WO 2005/104264 A1:

Formula (18)

wherein $R^1$ and $R^2$ have independently of each other one of the meanings given in Formula (6), $X^1$ and $X^2$ are independently of each other —$CR^1$=$CR^1$—, —C≡C— or —N—$Ar^8$—

$Ar^{5-8}$ are in case of multiple occurrence independently of one another a bivalent aromatic or heteroaromatic ring system having from 2 to 40 C atoms, which is optionally substituted by one or more groups $R^1$ as defined in Formula (6), g is in each occurrence independently of one another 0 or 1, h is in each occurrence independently of one another 0, 1 or 2.

The groups of Formula (18) are preferably selected from the following Formulae (19) and (20).

Formula (19)

Formula (20)

wherein $R^1$ and $R^2$ are as defined above for Formula (6), and are preferably alkyl or alkoxy with 1 to 12 C atoms or aryl or heteroaryl with 5 to 12 C atoms that is optionally substituted.

Further preferred backbone groups B are those of Formula (21) (dihydrophenanthrene derivatives):

Formula (21)

wherein $R^1$ and $R^2$ are as defined in Formula (6), $R^3$ and $R^4$ have independently of each other one of the meanings of $R^1$ and $R^2$, and $Ar^{6,7}$, $X^{1,2}$, g and h are as defined in Formula (18).

The groups of Formula (21) are preferably selected from the following Formulae (22) and (23).

Formula (22)

Formula (23)

wherein $R^1$ to $R^4$ are as defined above in Formula (21).

The groups of Formula (23) are also suitable as emissive groups $A^{em}$.

Further preferred backbone groups B are those of Formula (24) (spiro-bifluorene derivatives), as disclosed for example in WO 2003/020790 A1:

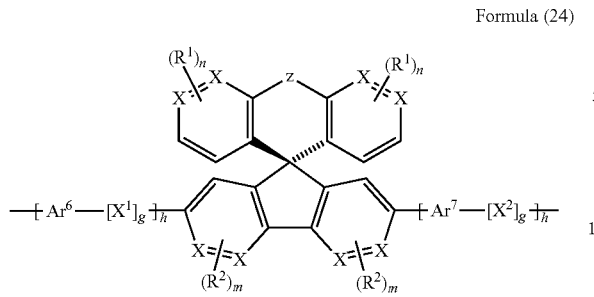

Formula (24)

wherein $Ar^{6,7}$, $X^{1,2}$, g and h are as defined in Formula (18),

X is in each occurrence independently of one another CH, $CR^1$ or N,

Z is in each occurrence independently of one another a single bond, $CR^5R^6$, $CR^5R^6$—$CR^5R^6$, $CR^5$=$CR^6$, O, S, N—$R^5$, C=O, C=$CR^5R^6$ or $SiR^5R^6$;

$R^{1,2}$ have independently of each other the meanings given in Formula (6), $R^{5,6}$ have independently of each other one of the meanings of for $R^1$, m is in each occurrence independently of one another 0, 1, 2, or 3, preferably 0, 1, or 2, very preferably 0 or 1, n is in each occurrence independently of one another 0, 1, 2, 3, or 4, preferably 0, 1, or 2, very preferably 1 or 2.

The groups of Formula (24) are preferably selected from the following Formulae (25) and (26).

Formula (25)

Formula (26)

wherein R have independently of each other one of the meanings of for $R^1$ as defined in Formula (6), r is as defined in Formula (24), and Ar has one of the meanings of $Ar^6$ and is preferably 1,4-phenylene that is optionally substituted by one or more groups L as defined above in Formulae (14) to (17).

Particularly preferred groups of Formula (24) are selected from the following Formulae (27) and (28).

Formula (27)

Formula (28)

wherein r and L are as defined above for Formulae (14) to (17), and L" independently of each other is selected from H or linear, branched or cyclic alkyl or alkoxy having 1 to 20 C atoms, or optionally substituted aryl having 5 to 30 C atoms, or —$N(Ar^9)_2$, wherein $Ar^9$ has one of the meanings of $Ar^6$ as defined above for Formula (18).

The groups of Formula (27) wherein L" is —$N(Ar^9)_2$ are also suitable as hole transporting groups $A^h$.

The groups of Formulae (27) and (28) are also suitable as emissive groups $A^{em}$.

Further preferred backbone groups B are those selected from the following Formulae:

Binaphthyl groups of Formula (29), as disclosed for example in WO 2006/063852 A1:

Formula (29)

wherein R, $Ar^6$, $Ar^7$, $X^1$, $X^2$, n, g and h are as defined above in Formula (24), and t is 0 or 1.

Groups of Formulae (30) and (31), as disclosed for example in WO 2005/056633A1, EP 1344788A1 and WO 2007/043495A1:

Formula (30)

Formula (31)

wherein ring A, ring B, ring C and ring D independently of each other represent an optionally substituted aromatic hydrocarbon ring; X represents —C(R$^1$R$^2$)—, —O—, —S—, —S(=O)—, —S(=O)$_2$—, —Si(R$^1$R$^2$)—, —B(R$^1$)—, (R$^1$)—, —P(=O)(R$^1$)—, —O—C(R$^1$R$^2$)—, or —N=C(R$^1$)—. If X is —C(R$^1$R$^2$)$_2$, then at least one of ring A and ring B, or at least one of ring C and ring D, is an aromatic hydrocarbon ring obtained by condensing a plurality of benzene rings; and R$^1$ and R$^2$ have one of the meanings given above in Formula (6), and may also together form a ring system. Ring A, ring B, ring C and ring D may have a substituent selected from the group consisting of an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, and imino group.

Preferred groups of Formula (30) are selected from the following Formulae (32) and (33).

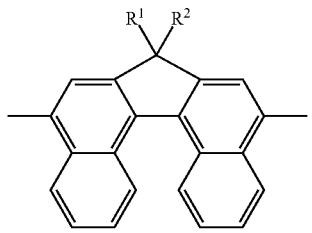

Formula (32)

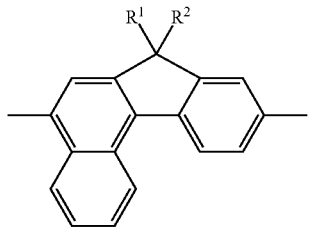

Formula (33)

wherein R$^1$ and R$^2$ are as defined above in Formula (6),

Groups of the following Formulae (34) and (35), as disclosed for example in WO 2005/033174 A1:

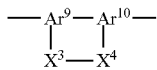

Formula (34)

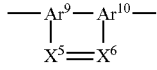

Formula (35)

wherein

Ar$^9$ and Ar$^{10}$ independently of each other denote a trivalent aromatic hydrocarbon group or a trivalent heterocyclic group, X$^3$ and X$^4$ independently of each other denote O, S, C(=O), S(=O), SO$_2$, C(R$^1$)(R$^2$), Si(R$^1$)(R$^2$), N(R$^1$), B(R$^1$), P(R$^1$) or P(=O)(R$^1$), X$^5$ and X$^6$ independently of each other denote N, B, P, C(R$^1$) or Si(R$^1$), R$^{1,2}$ are as defined above in Formula (6), and wherein X$^3$ and Ar$^{10}$ are bonded to adjacent carbon atoms in the aromatic ring of Ar$^{10}$, X$^4$ and Ar$^9$ are bonded to adjacent carbon atoms in the aromatic ring of Ar$^{10}$, X$^5$ and Ar$^{10}$ are bonded to adjacent atoms in the aromatic ring of Ar$^9$, and X$^6$ and Ar$^9$ are bonded to adjacent atoms in the aromatic ring of Ar$^{10}$.

The groups of Formula (34) are preferably of the following Formula (36):

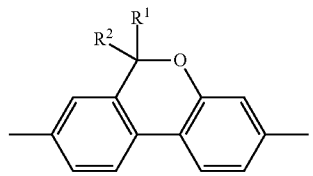

Formula (36)

wherein R$^1$ and R$^2$ are as defined above in Formula (6),

Groups of Formula (37), as disclosed for example in WO 2003/099901A1:

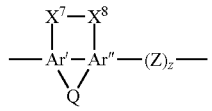

Formula (37)

wherein

Ar' and Ar" denote an aromatic hydrocarbon group or heterocyclic group;

one of X$^7$ and X$^8$ denotes C(=O) or C(R$^1$)(R$^2$) and the other denotes O, S, C(=O), S(=O), SO$_2$, C(R$^1$)(R$^2$), Si(R$^1$)(R$^2$), N(R$^1$), B(R$^1$), P(R$^1$) or P(=O)(R$^1$), Q is X$^9$, X$^9$—X$^{10}$ or X$^{11}$=X$^{12}$, X$^9$ and X$^{10}$ denote independently of each other O, S, C(=O), S(=O), SO$_2$, C(R$^1$)(R$^2$), Si(R$^1$)(R$^2$), N(R$^1$), B(R$^1$), P(R$^1$) or P(=O)(R$^1$), X$^{11}$ and X$^{12}$ denote independently of each other N, B, P, C(R$^1$) or Si(R$^1$), Z denotes —CR$^1$=CR$^2$— or —C≡C—, z is 0 or 1, R$^{1,2}$ are as defined above in Formula (6).

The groups of Formula (37) are preferably selected from the following Formulae (38) and (39).

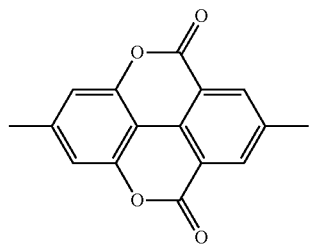

Formula (38)

Formula (39)

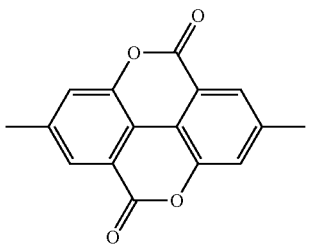

Groups of Formula (40), as disclosed for example in WO 2006/052457 A2 and WO 2006/118345A1:

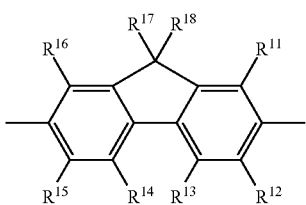

Formula (40)

wherein $R^{11}$-$R^{18}$ are independently of each other identical or different groups selected from the group consisting of H, halogen, alkyl, substituted alkyl, aryl, substituted aryl, heteroaryl, substituted heteroaryl, —CN, —CHO, —COR$^{20}$, —CR$^{20}$=NR$^{19}$, —OR$^{20}$, —SR$^{20}$, —SO$_2$R$^{20}$, —POR$^{20}$R$^{19}$, —PO$_3$R$^{20}$, —OCOR$^{20}$, —CO$_2$R$^{20}$, —NR$^{20}$R$^{19}$, —N=CR$^{20}$R$^{19}$, —NR$^{20}$COR$^{19}$, and —CONR$^{20}$R$^{19}$; and any of $R^{11-18}$ do optionally form a ring system with adjacent repeating units in the polymer; and $R^{17}$ and $R^{18}$ do optionally together form a ring system;

$R^{19}$ and $R^{20}$ are independently of each other selected from the group consisting of H, alkyl, substituted alkyl, aryl, substituted aryl, heteroaryl, and substituted heteroaryl; and adjacent $R^{19,20}$ groups do optionally together form a ring system;

and wherein either a) $R^{17}$ forms a ring system with $R^{16}$ or b) $R^{17}$ forms a ring system with $R^{16}$, and $R^{18}$ forms a ring system with $R^{11}$, wherein the two ring systems do optionally share more than one atom.

The groups of Formula (40) are preferably of the following Formula (41).

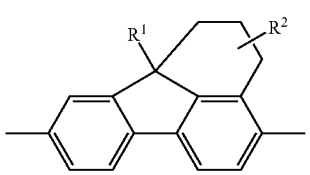

Formula (41)

wherein $R^1$ and $R^2$ are as defined above in Formula (6).

Groups of Formula (42), as disclosed for example in DE 102006003710.3:

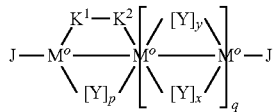

Formula (42)

wherein $M^o$ is in case of multiple occurrence independently of one another an aromatic, heteroaromatic or non-aromatic ring system having 2 to 40 C atoms, which is unsubstituted or substituted with one or more identical or different groups $R^1$, $K^{1,2}$ and Y are in case of multiple occurrence independently of one another a bridging group forming a cyclic system with M, selected from B(R$^1$), C(R$^1$)$_2$, Si(R$^1$)$_2$, C=O, C=S, C=Se, C=Te, C=NR$^1$, C=C(R$^1$)$_2$, O, S, S=O, SO$_2$, S(R$^1$)$_2$, N(R$^1$), P(R$^1$), P(=O)R$^1$, P(=S) R$^1$, C≡C or a combination or one, two, three or four of these groups, J is a linkage group to the polymer, and may also be a substituted or unsubstituted C—C-double or triple bond, a substituted aromatic or heteroaromatic or non-aromatic cyclic ring system having 2 to 40 C atoms, which is unsubstituted or substituted with one or more identical or different groups $R^1$, $R^1$ is as defined in Formula (6), x, y, p are in case of multiple occurrence independently of one another 0 or 1, with the proviso that at least one of x and y is 1, q is an integer ≥1.

The groups of Formula (42) are preferably selected from the following Formulae (43) and (44).

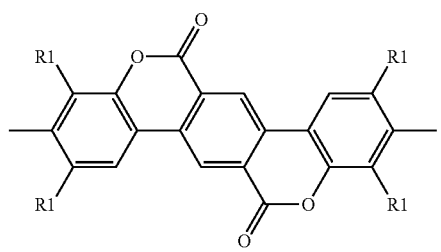

Formula (43)

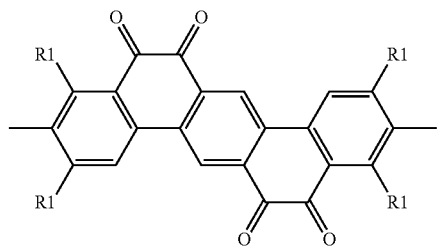

Formula (44)

wherein $R^1$ is defined as above in Formula (6).

Further suitable and preferred backbone groups are those selected from the following Formulae (45) and (46), as disclosed for example in WO 2006/114364A1 and EP 1345477A2:

Formula (45)

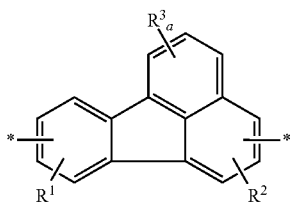

Formula (46)

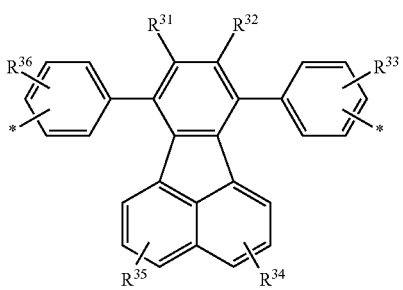

wherein $R^3$ and $R^{31-36}$ are independently of each other identical or different groups selected from H, alkyl, aryloxy, an aromatic rest, a condensed aromatic ring system, a heteroaromatic rest, —CH=CH(E)- or (Z)—CH=CH—$C_6H_5$, acryloyl, methacryloyl, methylstyryl, —O—CH=CH2, or glycidyl,

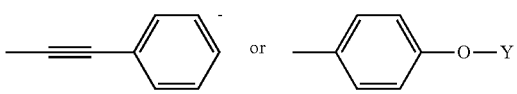

wherein Y represents acryloyl, methacryloyl, ortho-, or para-methylstyryl, —O—CH=$CH_2$ or glycidyl.

a is 0, 1, 2, or 3, and R1 and R2 are as defined in Formula (6).

Preferred hole transporting groups $A^h$ are those of Formula (47) (triarylamine derivatives):

Formula (47)

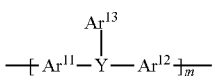

wherein

Y is N, P, P=O, $PF_2$, P=S, As, As=O, As=S, Sb, Sb=O or Sb=S, preferably N, $Ar^{11}$ which may be the same or different, denote, independently if in different repeat units, a single bond or an optionally substituted mononuclear or polynuclear aryl group, $Ar^{12}$ which may be the same or different, denote, independently if in different repeat units, an optionally substituted mononuclear or polynuclear aryl group, $Ar^{13}$ which may be the same or different, denote, independently if in different repeat units, an optionally substituted mononuclear or polynuclear aryl group, and m is 1, 2 or 3.

The groups of Formula (47) are preferably selected from the following Formulae (48) to (50).

Formula (48)

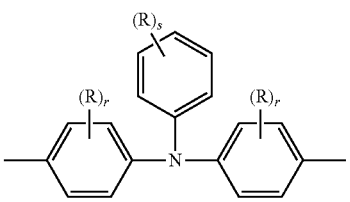

Formula (49)

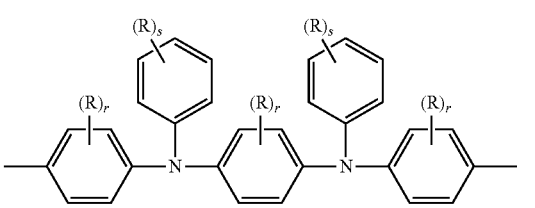

Formula (50)

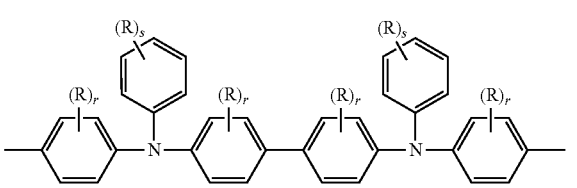

wherein R is as defined in Formula (6), r is as in Formula (25), and s is 0, 1, 2, 3, 4 or 5.

Particularly preferred groups of Formula (47) are selected from the following Formulae (51) to (59).

Formula (51)

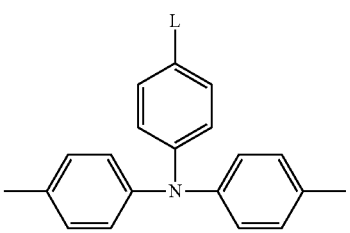

Formula (52)

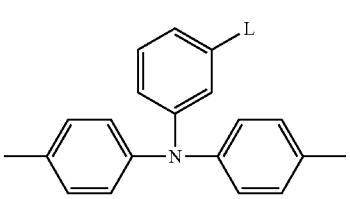

Formula (53)

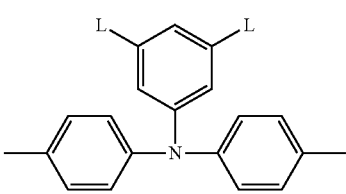

-continued

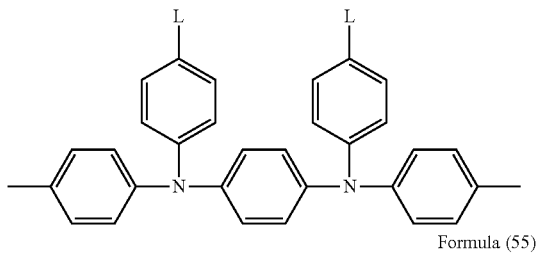
Formula (54)

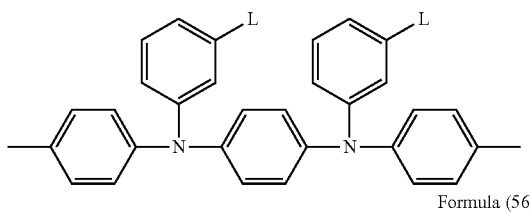
Formula (55)

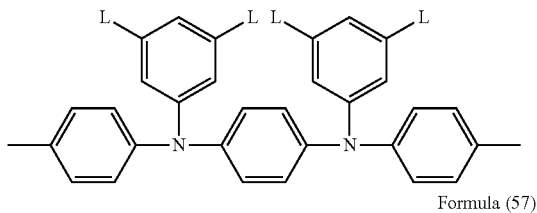
Formula (56)

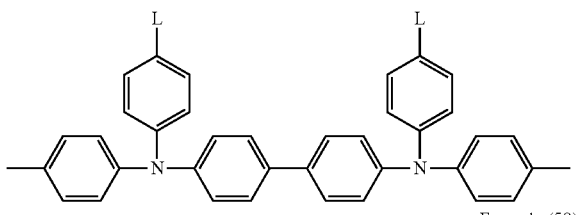
Formula (57)

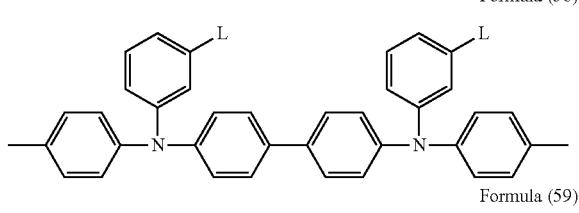
Formula (58)

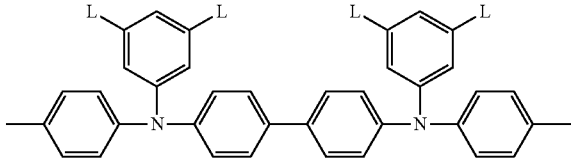
Formula (59)

wherein L is as defined above in Formulae (15) to (17).

Very preferred hole transporting groups $A^h$ are those of Formula (48).

The groups of Formula (3) are also suitable as exciton formation groups $A^{ex}$, especially preferably those of Formula (49).

Further preferred hole transporting groups $A^h$ are those of Formula (60).

$$-(T^1)_c\text{-}(Ar^{14})_d\text{-}(T^2)_e\text{-}(Ar^{15})_f-$$ Formula (60)

wherein $T^1$ and $T^2$ are independently of each other selected from thiophene, selenophene, thieno[2,3b]thiophene, thieno[3, 2b]thiophene, dithienothiophene and pyrrole, all of which are optionally substituted with $R^5$, $R^5$ has in each occurrence independently of one another one of the meanings of $R^1$ in Formula (6) that is different from H, $Ar^{14}$ and $Ar^{15}$ are independently of each other mononuclear or polynuclear aryl or heteroaryl, which is optionally substituted and optionally fused to the 2,3-positions of one or both of the adjacent thiophene or selenophene groups, c and e are independently of each other 0, 1, 2, 3 or 4, with $1<c+e\leq 6$, d and f are independently of each other 0, 1, 2, 3 or 4.

The groups $T^1$ and $T^2$ are preferably selected from thiophene-2,5-diyl (Formula (61)), selenophene-2,5-diyl (Formula (62)), thieno[3,2b]thiophene-2,5-diyl (Formula (63)), thieno[2,3b]thiophene-2,5-diyl(Formula (64)), dithienothiophene-2,6-diyl (Formula (65)) and pyrrole-2,5-diyl (Formula (66)).

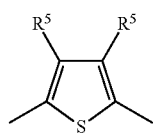
Formula (61)

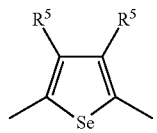
Formula (62)

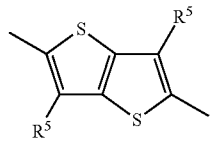
Formula (63)

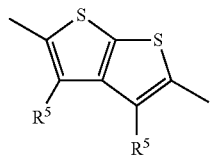
Formula (64)

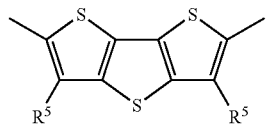
Formula (65)

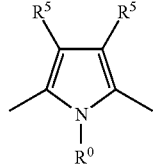
Formula (66)

wherein both $R^0$ and $R^5$ are defined as in Formula (6).

The groups of Formula (60) are preferably selected from the following Formulae (67) to (84).

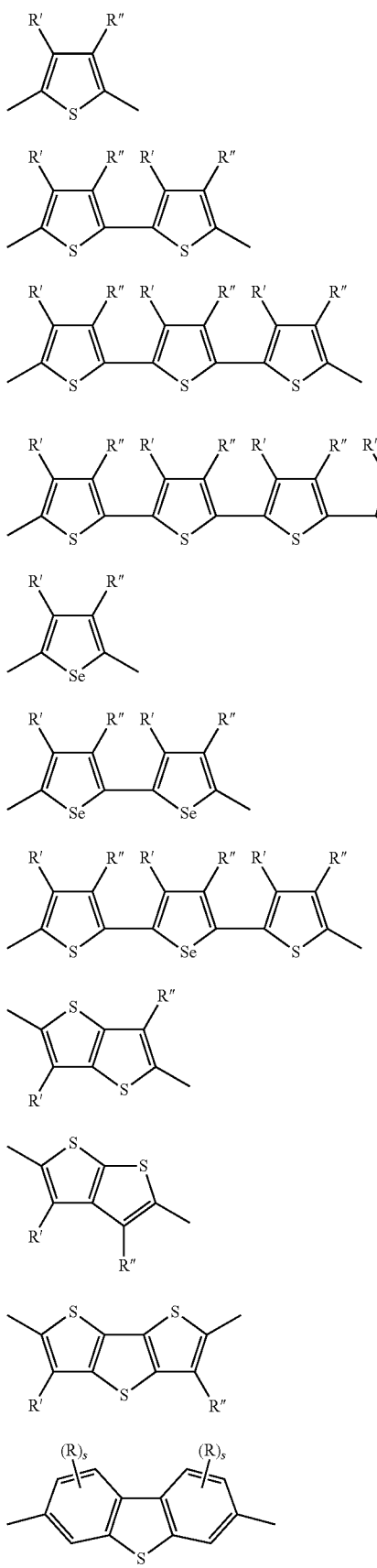
wherein Y' is CH or N, k is S or Se, $R^0$ is defined as in Formula (6), R is defined as in Formula (12), s is 0, 1, 2 or 3, r is 0, 1, 2, 3, or 4, t is 0, 1, or 2, and R', R", R'" and R"" have independently of each other one of the meanings of $R^1$ as defined in Formula (6).
Particularly preferred groups of Formula (60) are selected from the following Formulae (85) to (95).

Formula (85)
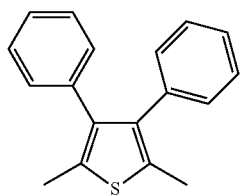

Formula (86)
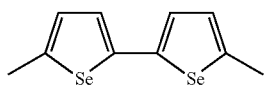

Formula (87)
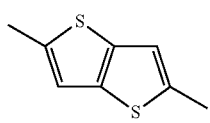

Formula (88)
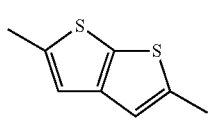

Formula (89)
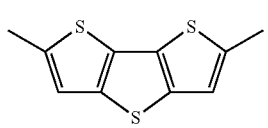

Formula (90)
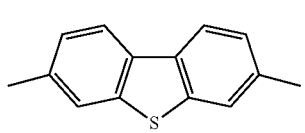

Formula (91)
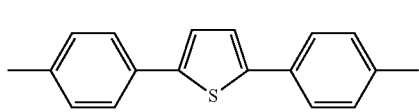

Formula (92)
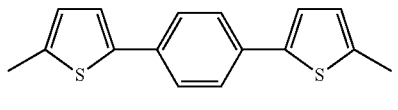

Formula (93)
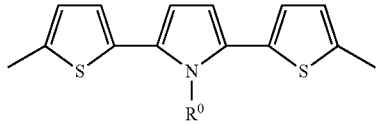

Formula (94)
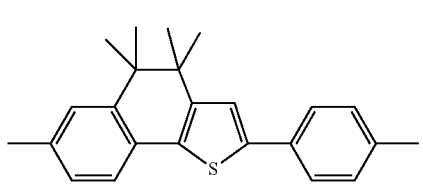

Formula (95)
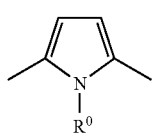

wherein the thiophene, thienothiophene and phenyl groups may also be substituted with one or more groups R' as defined above, $R^0$ is as defined above in Formula (6) and is preferably $C_{1-8}$-alkyl, very preferably methyl.

In addition to the groups of Formula (6) to (60) as disclosed above and below, polymer or oligomer of Formulae (4) and (5) may comprise one or more further groups preferably selected from groups have hole transporting properties. Suitable hole transporting groups $A^h$ include, without limitation benzidine, triarylphosphine, phenothiazine, phenoxazine, dihydrophenazine, thianthrene, dibenzo-p-dioxine, phenoxathiine, carbazole, azulene, pyrrole and furan derivatives, or further O-, S- or N-containing heterocycles preferably having a high HOMO. The amount of said additional groups in the polymer is preferably from 1 to 15 mol %.

In addition, polymer and/or oligomer may comprise one or more units of Formula (47) as exciton formation unit in a concentration so that they act as hole trap instead of hole transport material. Typical concentrations are from 0.01 to 15 mol %, very preferably from 0.1 to 10 mol %, most preferably from 1 to 5 mol %.

Further preferred emissive groups $A^{em}$ are those selected from the following Formulae:

Vinyltriarylamines of Formula (96), as disclosed for example in DE 10 2005 060473:

Formula (96)
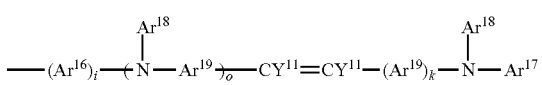

wherein
$Ar^{16}$ is in each occurrence independently of one another mono- or polycyclic aryl or heteroaryl, which is optionally substituted by one or more groups $R^{21}$,
$Ar^{17}$ is in each occurrence independently of one another mono- or polycyclic aryl or heteroaryl, which is optionally substituted by one or more groups $R^{22}$,
$Ar^{18}$ is in each occurrence independently of one another mono- or polycyclic aryl or heteroaryl, which is optionally substituted by one or more groups $R^{23}$,
$Ar^{19}$ is in each occurrence independently of one another mono- or polycyclic aryl or heteroaryl, which is optionally substituted by one or more groups $R^{24}$,
$Y^{11}$ is in case of multiple occurrence independently of one another selected from H, F, Cl or carbyl or hydrocarbyl with 1 to 40 C atoms that is optionally substituted and optionally comprises one or more hetero atoms, and optionally two groups $Y^{11}$, or a group $Y^{11}$ and an adjacent group $R^{21}$, $R^{24}$, $Ar^{16}$ or $Ar^{19}$, do together form an aromatic, mono- or polycyclic ring system,
$R^{21-24}$ are independently of each other identical or different groups selected from H, halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, and wherein optionally two or more groups $R^{21-24}$ do together form an aliphatic or aromatic, mono- or polycyclic ring system; and wherein $R^{21}$, $R^{22}$ and $R^{23}$ may also denote a covalent bond in a polymer,
X, $R^0$ and $R^{00}$ are as defined in Formula (6),
i is in each occurrence independently of one another 1, 2 or 3,
k is in each occurrence independently of one another 1, 2 or 3,
o is in each occurrence independently of one another 0 or 1.

The groups of Formula (96) are preferably selected from the following Formulae (97) to (107).

Formula (97)
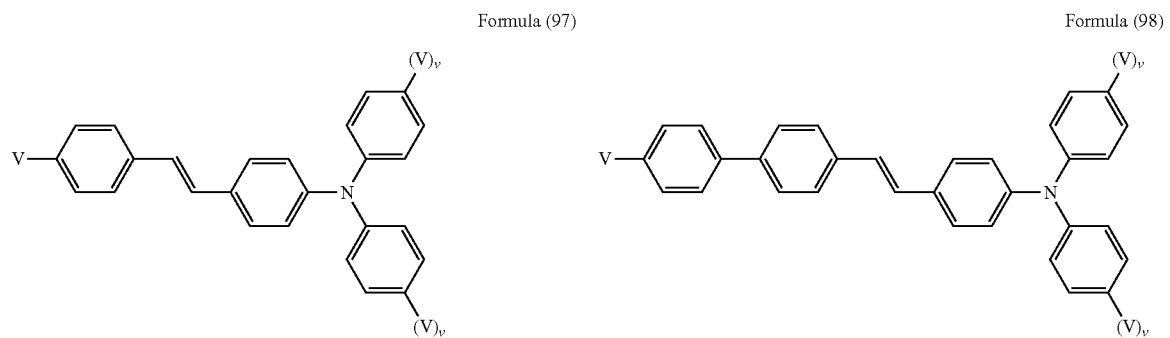
Formula (98)
Formula (99)
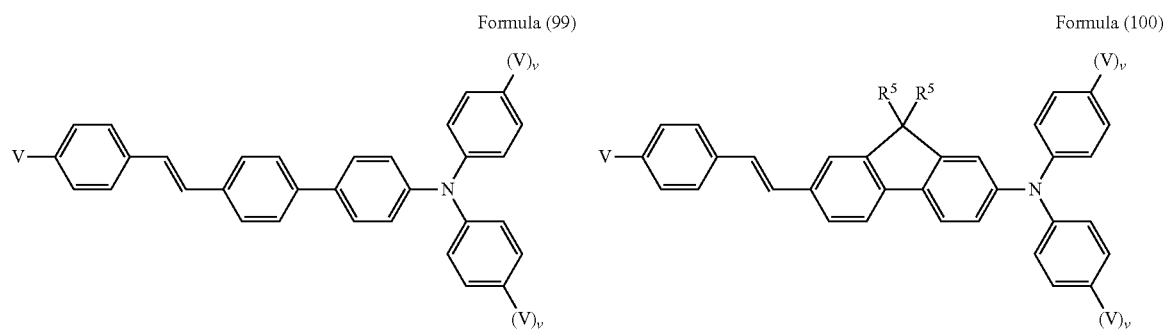
Formula (100)
Formula (101)
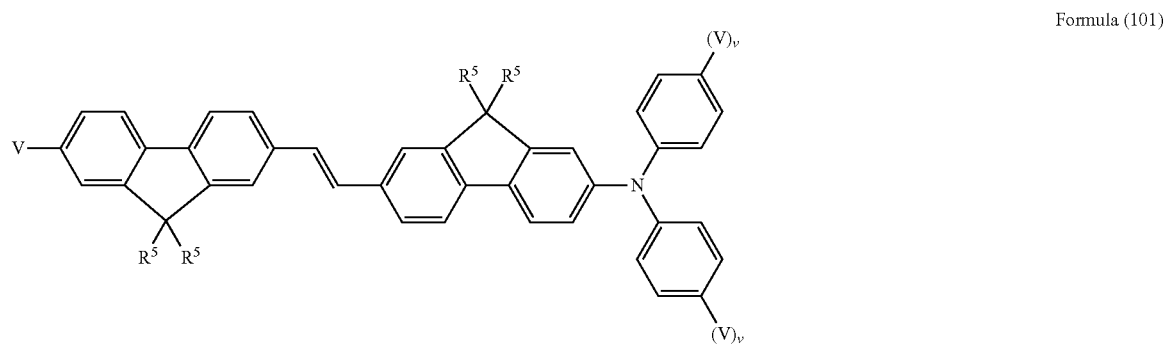
Formula (102)
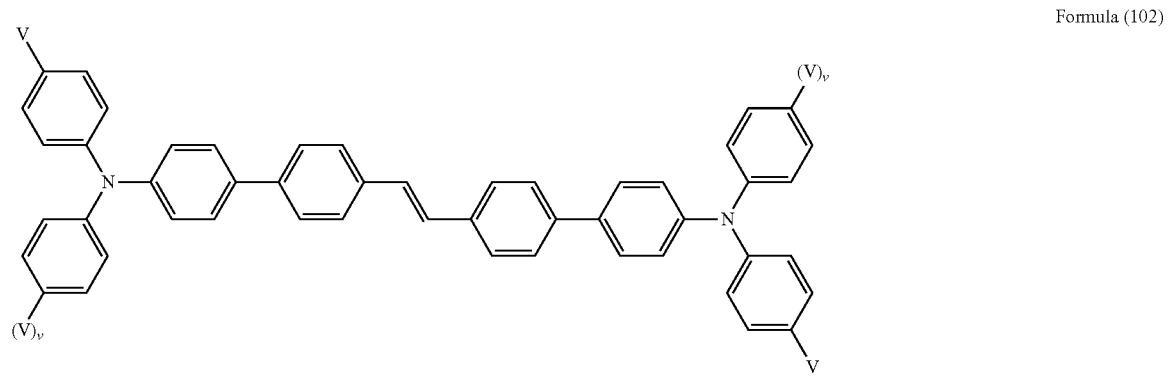

-continued
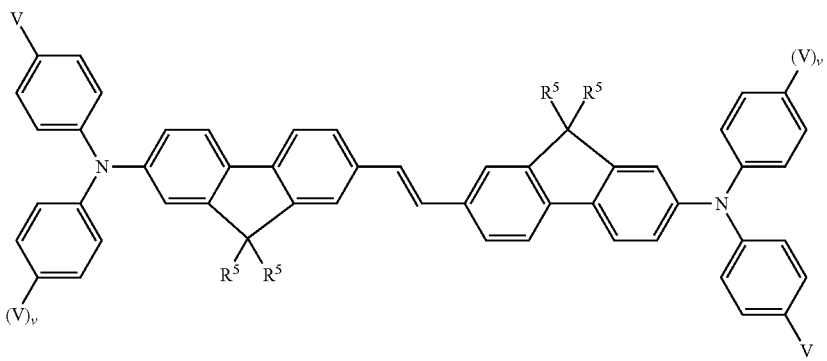
Formula (103)
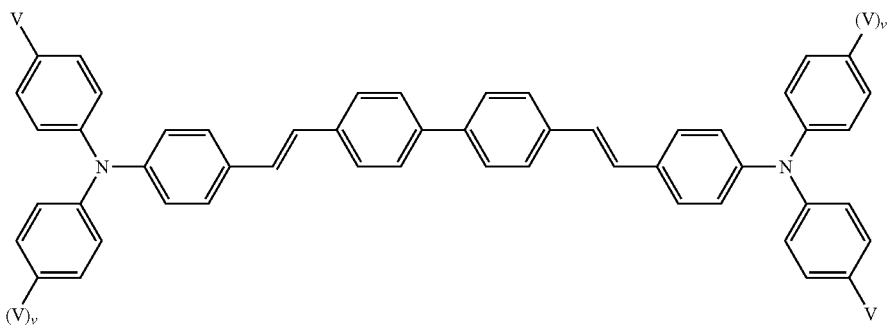
Formula (104)
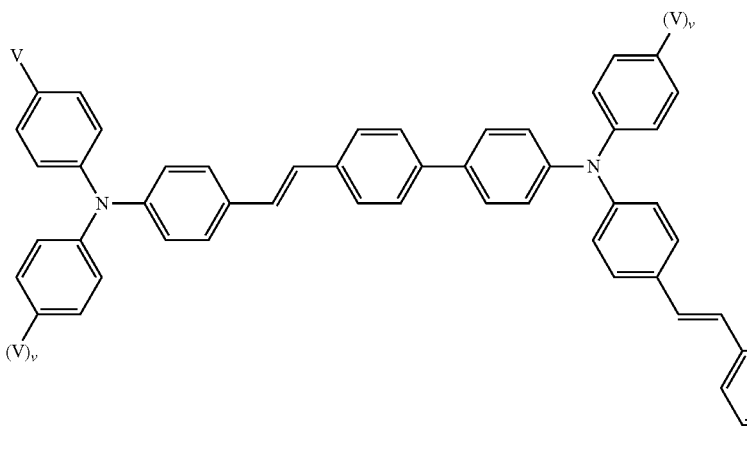
Formula (105)
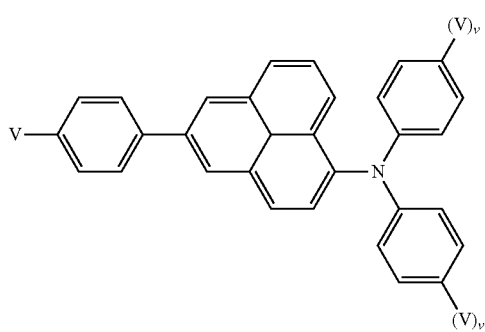
Formula (106)
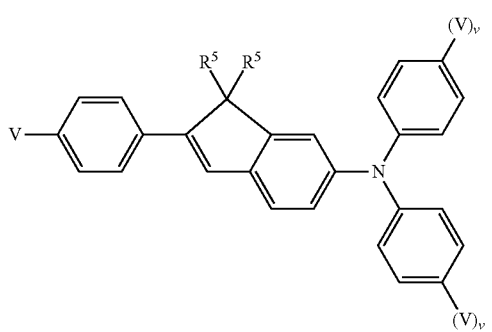
Formula (107)

wherein V is a covalent bond in a polymer, v is 0 or 1, and R⁵ has one of the meanings of $R^{24}$ given above. The benzene rings are optionally substituted by one or more groups R⁵.

1,4-Bis(2-thienylvinyl)benzenes of Formula (108), as disclosed for example in WO 2005/030827:

Formula (108)

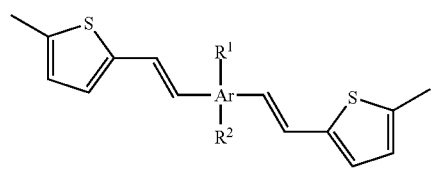

wherein $R^1$ and $R^2$ are as defined in Formula (6) and Ar has one of the meanings of $Ar^{11}$ given in Formula (47).

The groups of Formula (108) are preferably of the following Formula (109).

Formula (109)

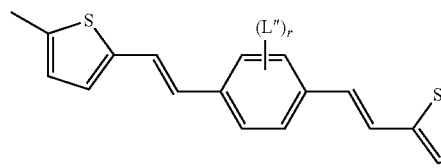

wherein L″ has the same meaning as $R^1$ in Formula (6), r is 0, 2, 2, 3 or 4, and L″ is preferably alkyl, aryl, perfluoroalkyl, thioalkyl, cyano, alkoxy, heteroaryl, alkylaryl, or arylalkyl, very preferably H, phenyl, $C_{1-12}$-alkyl or -alkoxy.

Very preferred groups of Formula (108) are of the following Formula (110).

Formula (110)

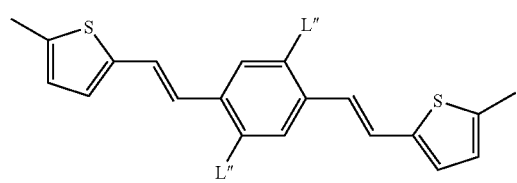

wherein L″ is preferably alkyl, aryl, perfluoroalkyl, thioalkyl, cyano, alkoxy, heteroaryl, alkylaryl, or arylalkyl, very preferably H, phenyl, $C_{1-12}$-alkyl or -alkoxy.

1,4-Bis(2-arylenvinyl)benzenes of Formula (111), as disclosed for example in WO 00/46321:

Formula (111)

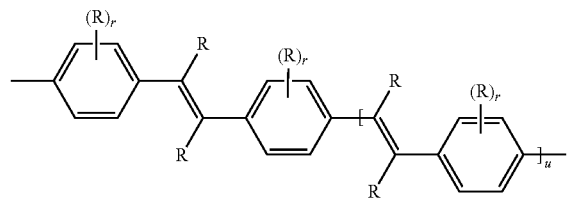

wherein r is 0, 1, 2, 3, or 4, and R has the same meaning of $R^1$ in Formula (6), respectively, and u is 0 or 1.

The groups of Formula (111) are preferably selected from the following Formulae (112) to (114).

Formula (112)

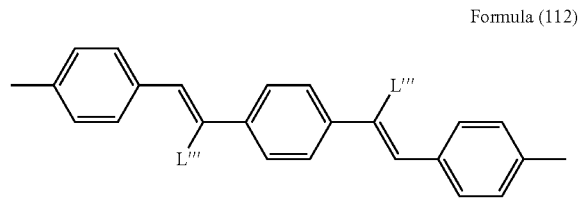

Formula (113)

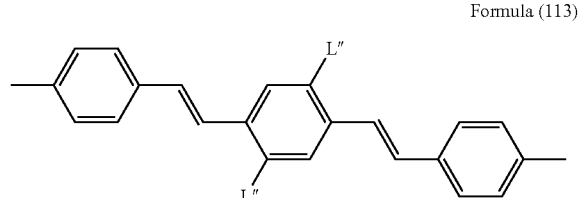

Formula (114)

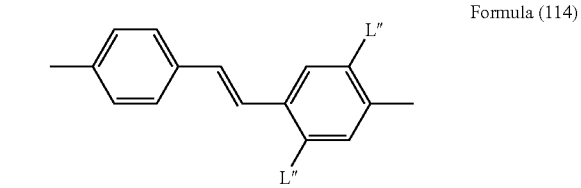

wherein L″ is preferably alkyl, aryl, perfluoroalkyl, thioalkyl, cyano, alkoxy, heteroaryl, alkylaryl, or arylalkyl, very preferably H, phenyl, $C_{1-12}$-alkyl or -alkoxy; and L‴ is H, F, Cl, CN or optionally fluorinated linear, branched or cyclic alkyl having 1 to 20 C atoms, or optionally substituted aryl having 5 to 30 C atoms, preferably H or phenyl.

Groups of Formula (115).

Formula (115)

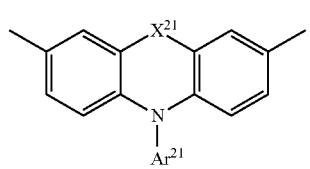

wherein
$X^{21}$ is O, S, $SO_2$, $C(R^x)_2$ or N—$R^x$ wherein $R^x$ are independently of each other identical or different groups selected from aryl or substituted aryl or aralkyl with 6 to 40 C atoms, or alkyl with 1 to 24 C atoms, preferably aryl with of 6 to 24 C atoms, very preferably alkylated aryl with 6 to 24 C atoms, Ar²¹ is optionally substituted aryl or heteroaryl with 6 to 40, preferably 6 to 24, very preferably 6 to 14 C atoms.

Groups of the following Formulae (116) and (117).

Formula (116)

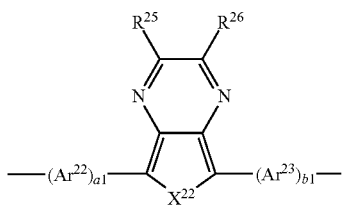

Formula (117)

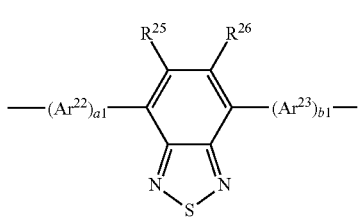

wherein

X²² is R²⁷C=CR²⁷ or S, wherein preferably each R²⁷ is independently selected from hydrogen, alkyl, aryl, perfluoroalkyl, thioalkyl, cyano, alkoxy, heteroaryl, alkylaryl, or arylalkyl, R²⁵ and R²⁶ have independently of each other one of the meanings of R¹ and R² as defined in Formula (6), Ar²² and Ar²³ are in case of multiple occurrence independently of one another a bivalent aromatic or heteroaromatic ring system having from 2 to 40 C atoms, which is optionally substituted by one or more groups R²⁵, and a1 and b1 are in each occurrence independently of one another 0 or 1.

Groups of the following Formulae (118) and (119).

Formula (118)

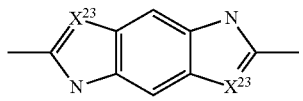

Formula (119)

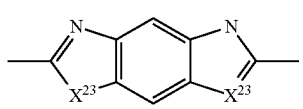

wherein X²³ is NH, O, or S.

Groups of the following Formulae (120) to (130).

Formula (120)

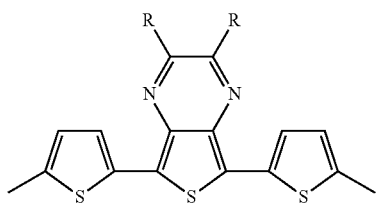

Formula (121)

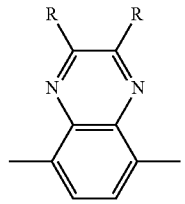

Formula (122)

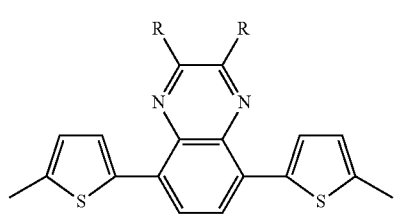

Formula (123)

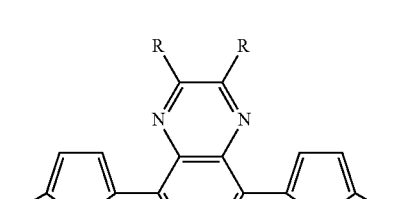

Formula (124)

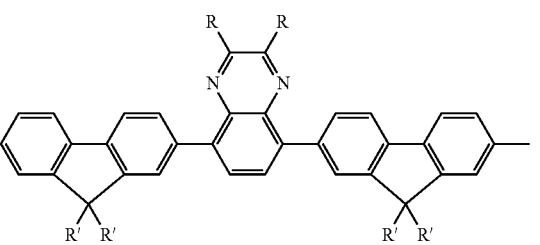

Formula (125)

Formula (126)

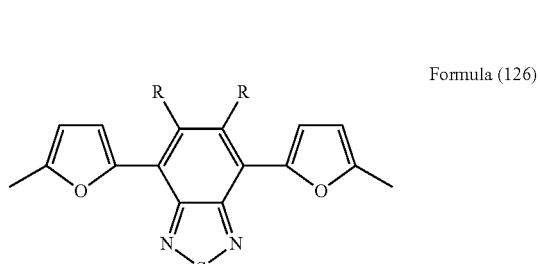

Formula (127)

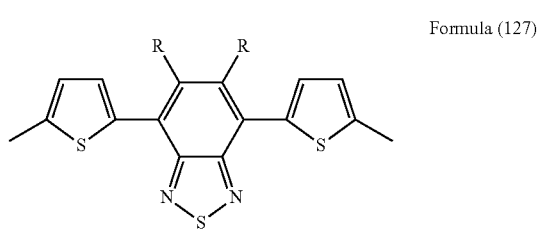

Formula (128)

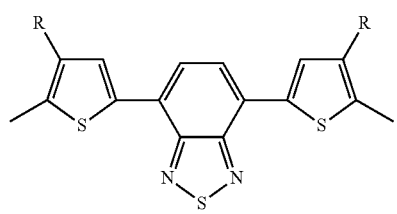

Formula (129)

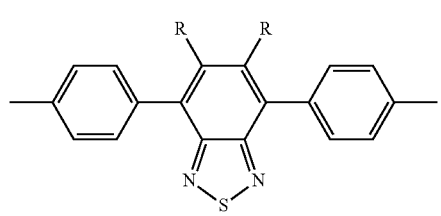

Formula (130)

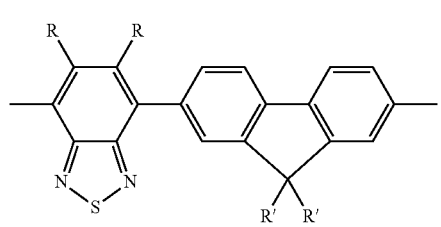

wherein R and R' has the same meaning as $R^1$ in Formula (6), and are in each occurrence independently of one another preferably H, alkyl, aryl, perfluoroalkyl, thioalkyl, cyano, alkoxy, heteroaryl, alkylaryl, or arylalkyl. R is preferably H, phenyl, or alkyl having 1, 2, 3, 4, 5 or 6 C atoms. R' is preferably n-octyl or n-octyloxy;

Groups selected from the following Formulae (131) to (142):

Formula (131)

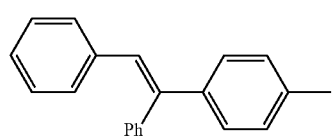

Formula (132)

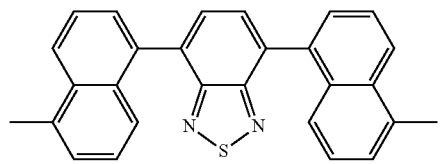

Formula (133)

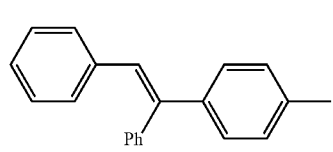

Formula (134)

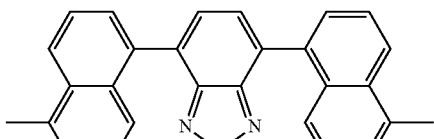

Formula (135)

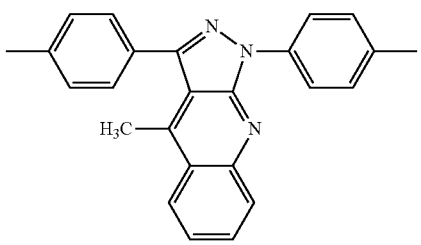

Formula (136)

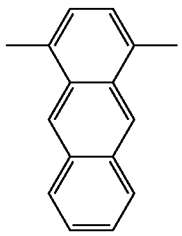

Formula (137)

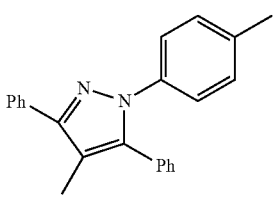

Formula (138)

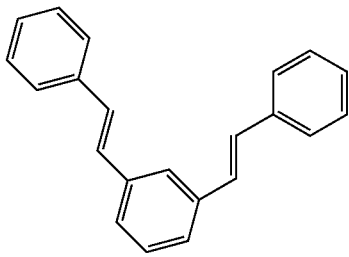

Formula (139)

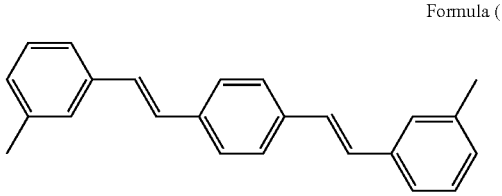

Formula (140)

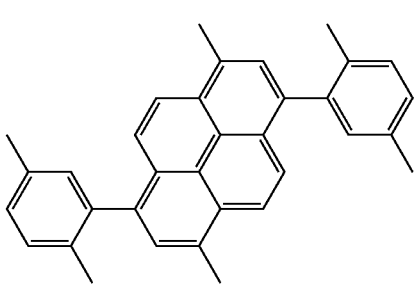

Formula (141)

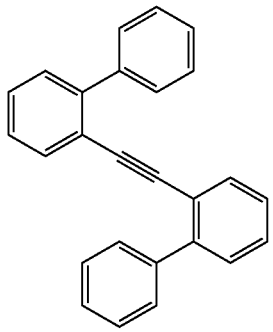

Formula (142)

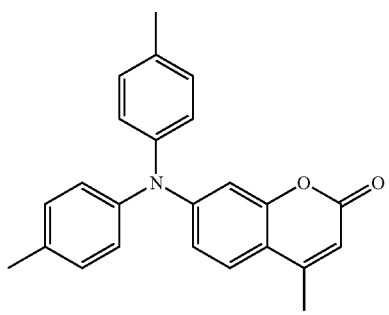

wherein Ph denotes phenyl;

Further suitable and preferred groups that can be used as exciton formation groups $A^{ex}$ or emissive groups $A^{em}$ are those selected from the following formulae:

Triazines of Formula (143):

$$Ar^{24}\text{—}N(Ar^{25})_2 \qquad \text{Formula (143)}$$

wherein $Ar^{24}$ is a substituted heteroaryl group and each $Ar^{25}$ is the same or different and comprises a substituted aryl or heteroaryl group.

Preferred groups of this type are the following:

Formula (144)

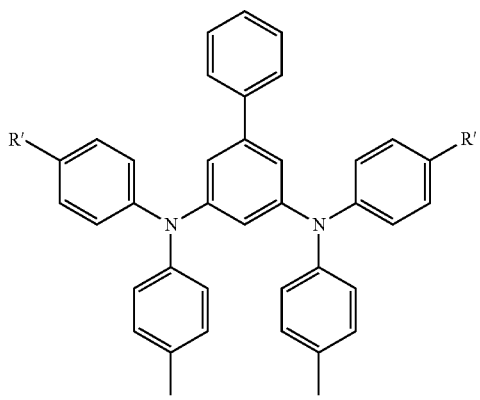

Formula (145)

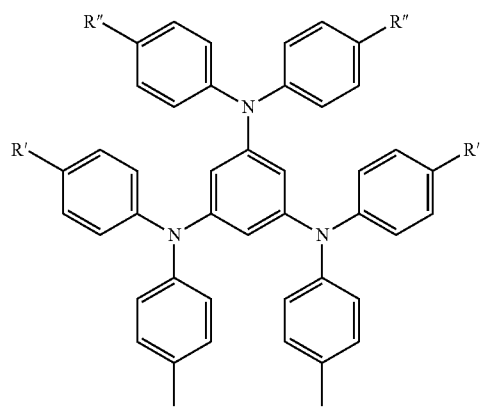

Formula (146)

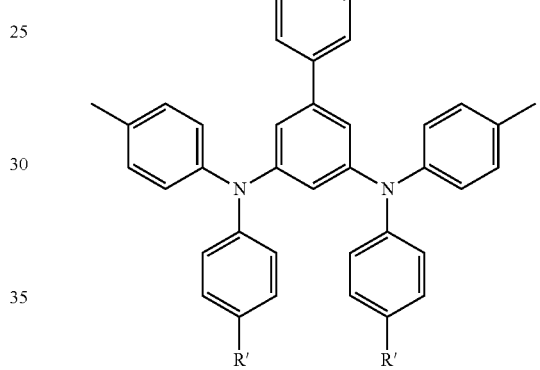

Formula (147)

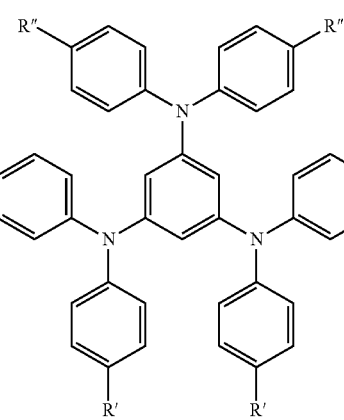

wherein R' and R" are as defined above in Formulae (67) to (84);

Triarylamines of Formula (148) comprising one or more heteroaromatic groups (as disclosed for example in WO 03/35714):

$$\text{—}Ar^{26}\text{—}Ar^{27}\text{—}N(Ar^{28})\text{—}Ar^{29}\text{—}Ar^{30}\text{—} \qquad \text{Formula (148)}$$

wherein $Ar^{26\text{-}30}$ have independently of each other one of the meanings of $Ar^1$ given above.

Preferred groups of this type are the following:

Formula (149)

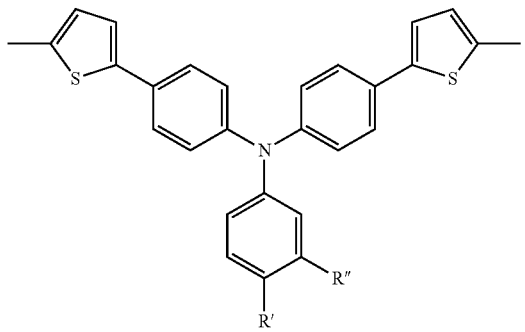

Formula (150)

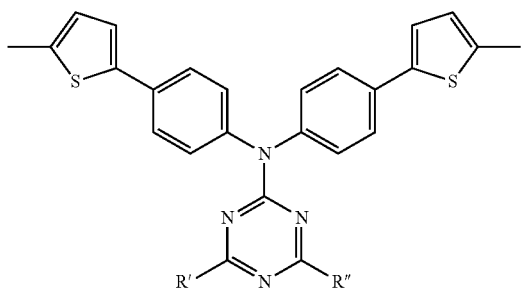

Formula (151)

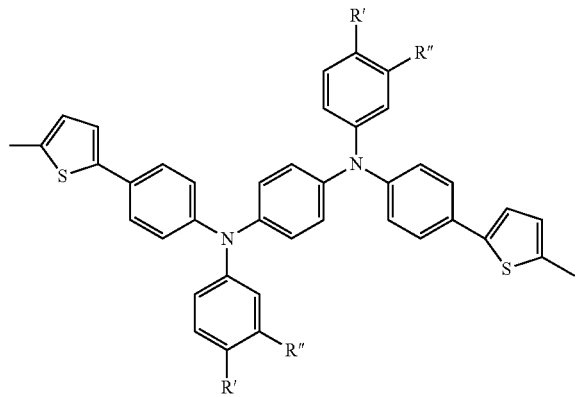

wherein R' and R" are as defined above and are preferably alkyl, perfluoroalkyl, alkylaryl, arylalkyl, heteroaryl, aryl, alkoxy, aryloxy or thioalkyl.

Further preferred groups for $Ar^2$ in Formulae (2) to (5) are those of Formula (152) (fluorene derivatives):

Formula (152)

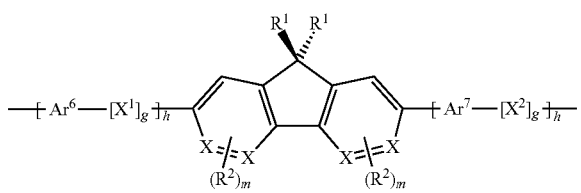

wherein $R^{1,2}$ have in each occurrence independently of one another one of the meanings given in Formula (6), and $Ar^{6,7}$, $X^{1,2}$, g and h are as defined in Formula (18).

The groups of Formula (152) are preferably selected from the following Formulae (153) and (154), as disclosed for example in U.S. Pat. No. 5,962,631:

Formula (153)

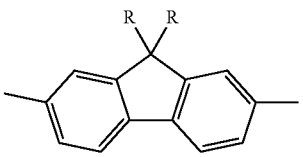

Formula (154)

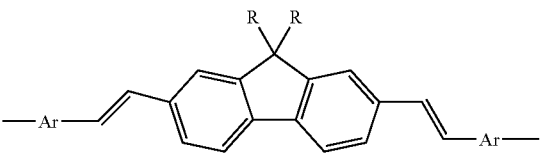

wherein R has the same meaning as $R^1$ in Formula (6), and Ar has one of the meanings of $Ar^6$ and is preferably 1,4-phenylene that is optionally substituted by one or more groups L as defined above in Formulae (15) to (17).

Particularly preferred groups of Formula (152) are selected from the following Formulae (155) and (156).

Formula (155)

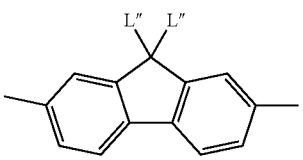

Formula (156)

wherein r and L are as defined above, and L" independently of each other is selected from H or linear, branched or cyclic alkyl or alkoxy having 1 to 20 C atoms, or optionally substituted aryl having 5 to 30 C atoms, or —N(Ar)$_2$, wherein Ar has one of the meanings of $Ar^6$ as defined above.

The groups of Formulae (154) and (156) are also suitable as emissive groups $A^{em}$.

The compound of the present invention may further comprise one or more identical or different phosphorescent emissive groups $A^{em}$. Suitable groups of this type are known to the expert and are described in the literature.

Especially preferred are groups based on or derived from metal complexes.

These groups are preferably selected of the formula M(L)$_z$, wherein M is a metal atom, L is in each occurrence independently of one another an organic ligand that is bonded to or coordinated with M via one, two or more positions, and z is an integer larger than 1, preferably 1, 2, 3, 4, 5 or 6, and wherein these groups are linked to the polymer via one or more, preferably one, two or three positions, preferably via the ligands L.

M is a metal atom preferably selected from transition metals, especially those of group VIII, or lanthanoides, very preferably selected from Rh, Os, Ir, Pt, Au, Sm, Eu, Gd, Tb, Dy, Re, most preferably Os, Ir, Rh or Pt. M may also denote Al, Be or Zn.

L is preferably a mono- or bidentate organic ligand which can be neutral (non-ionic) or anionic. Such ligands are known in the art. Suitable neutral monodentate ligands are for example CO, isonitriles, amines, phosphines, phosphites, arsines, stilbines, or N-heterocycles like pyridine, pyridazine, pyrazine or triazine. Suitable anionic monodentate ligands are for example halogenides, cyanide, cyanates, isocyanates, thiocyanates, isothiocyanates, alcoholates, thioalcoholates, amides, carboxylates, or anionic N-heterocycles like pyrrolide, imidazolide, pyrazolide. Suitable bidentate ligands are for example diamines like ethylenediamine or its N-alkylated derivatives, imines, diimines, heterocycles with two N atoms like 2,2'-bipyridine or o-phenathroline, diphosphines, 1,3-diketonates derived from 1,3-diketones like acetylacetone, 3-ketonates derived from 3-keto esters, carboxylates derived from amino carboxylic acids like pyridine-2-carboxylic acid, quinoline-2-carboxylic acid, picolinic acid (pyridine-2-carboxylic) acid, salicyl iminates derived from salicyl imines, dialcoholates derived from dialcoholes like ethylene glycol or dithiolates derived from dithioles like 1,2-ethylene dithiolate. Further suitable ligands are selected from mono- or polycyclic aromatic or heteroaromatic groups having 4 to 50 C atoms, preferably containing at least one N atom, which are optionally substituted, like for example 8-quinolinol, benzoquinolinol, 2-phenyl pyridine, 2-phenyl benzothiazole, 2-phenyl-benzoxazole, porphyrine or their derivatives.

Suitable and preferred groups of this type are for example those of the following Formulae (157) to (162) (as disclosed, e.g., in WO 02/68435):

Formula (157)
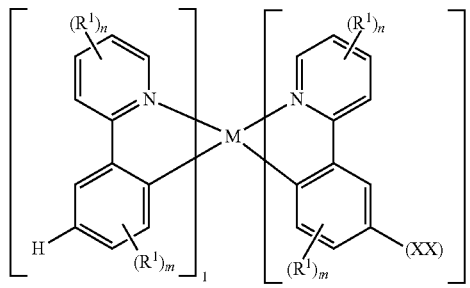

Formula (158)
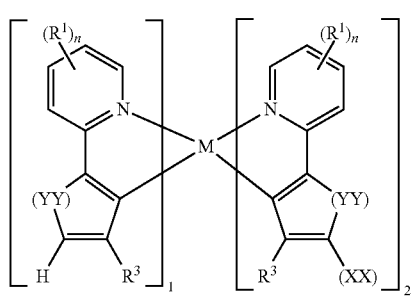

Formula (159)
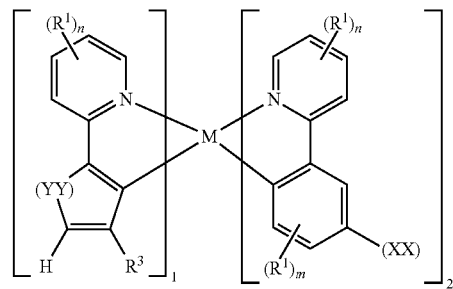

Formula (160)
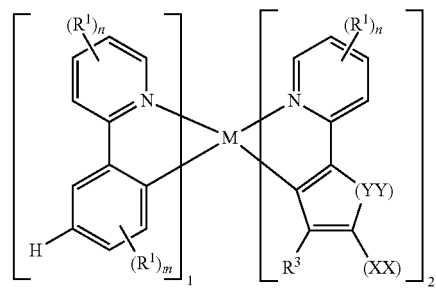

Formula (161)
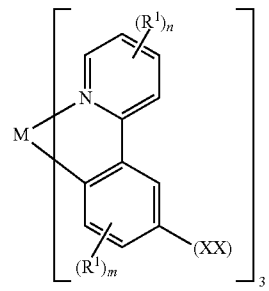

Formula (162)
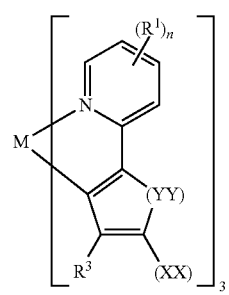

wherein $R^1$ and $R^3$ have the same meaning as $R^1$ in Formula (6), m is 0, 1, 2, or 3, n is 0, 1, 2, 3, or 4, M is a metal atom as defined above, preferably Rh or Ir, XX is a linkage in the polymer and YY is in each occurrence independently of one another O, S or Se.

Further suitable and preferred groups of this type are for example those as disclosed in U.S. Pat. No. 6,696,180 or US 2002/0193532 A1:

Formula (164)
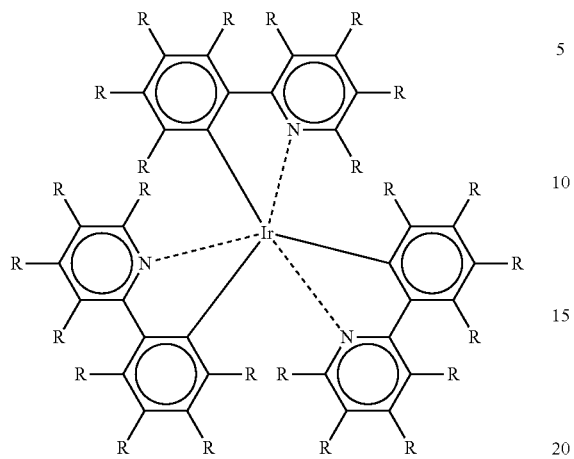
Formula (165)
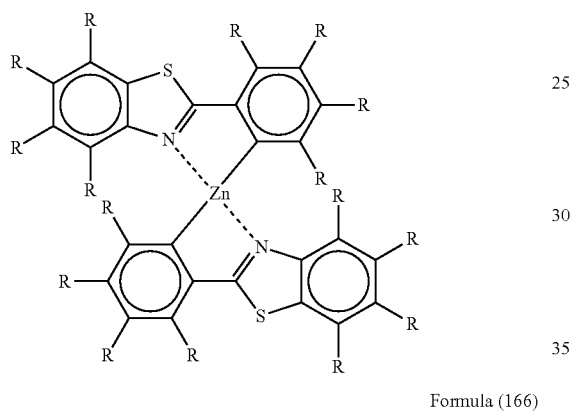
Formula (166)
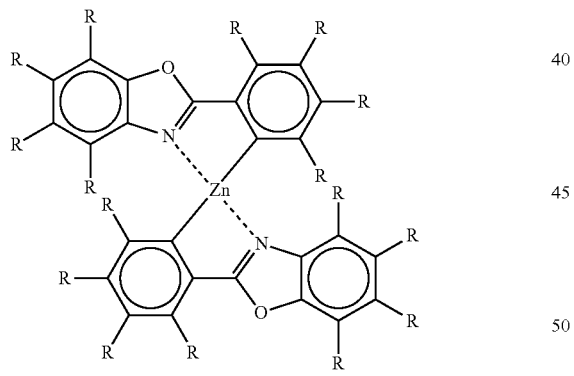
Formula (167)
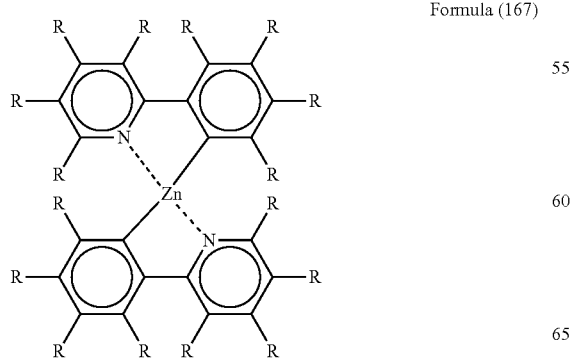
Formula (168)
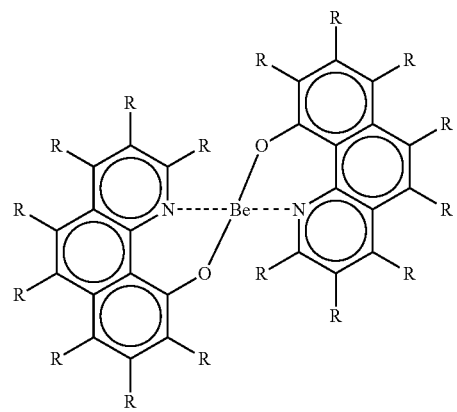
Formula (169)
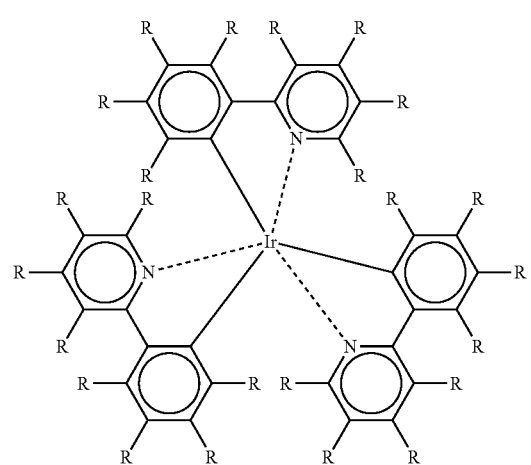
Formula (170)
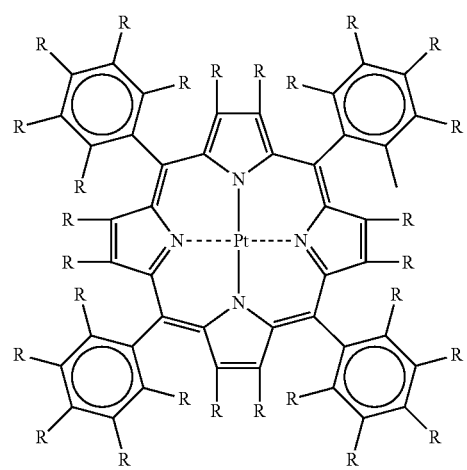

Formula (171)
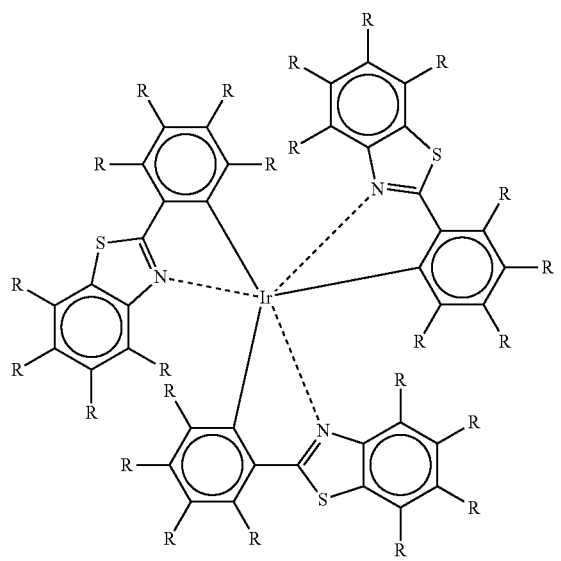
Formula (172)
Formula (173)
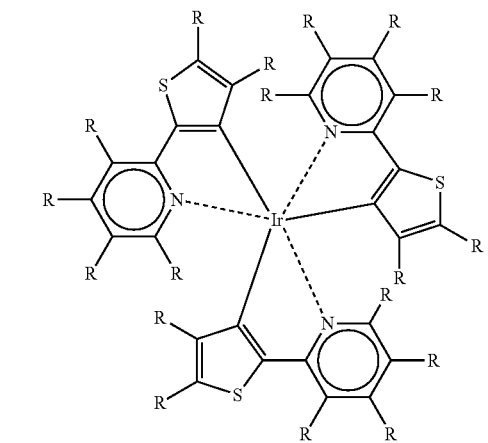
Formula (174)
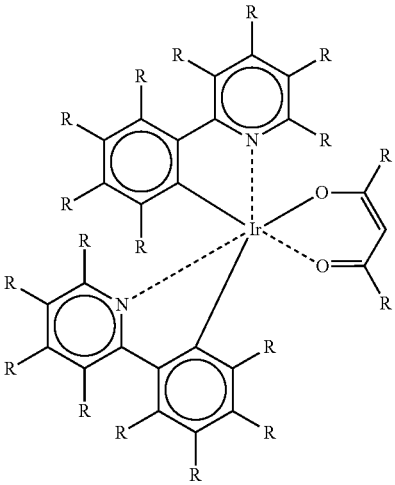
Formula (175)
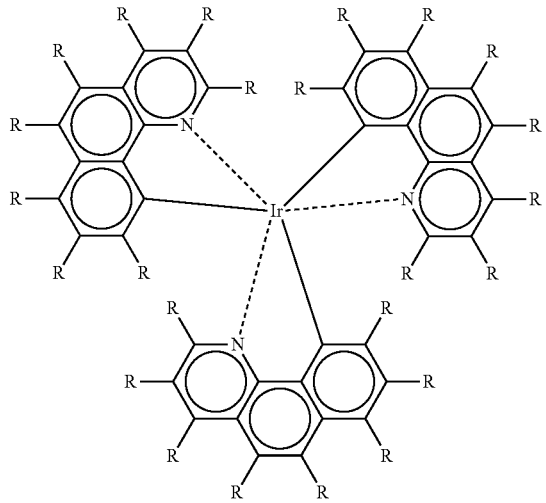
Formula (176)
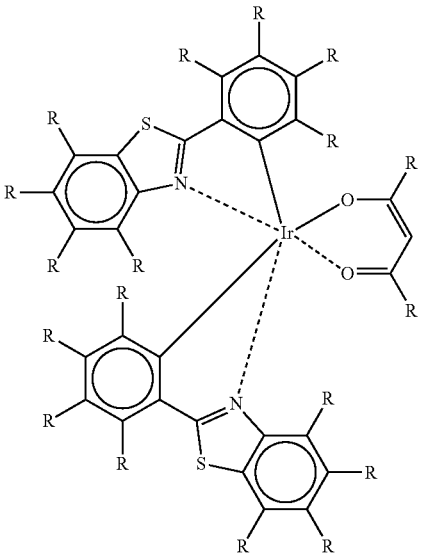

Formula (177)
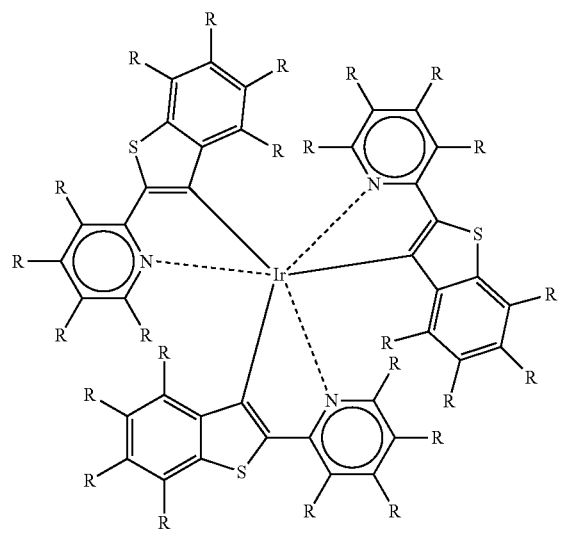
Formula (178)
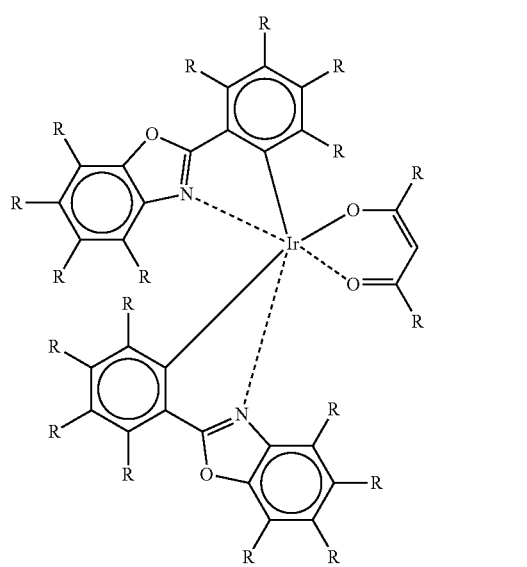
Formula (179)
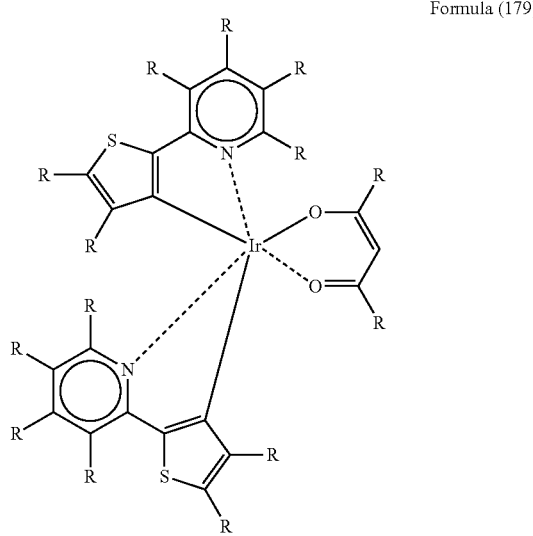
Formula (180)
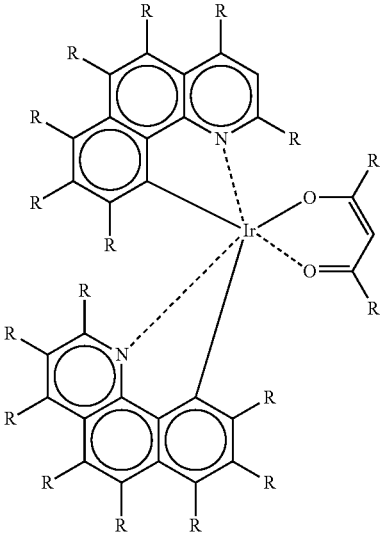
Formula (181)
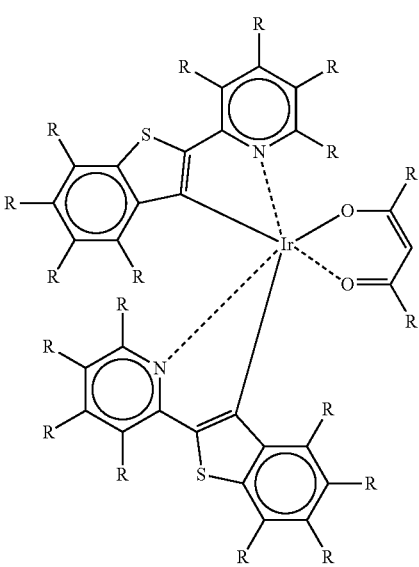
Formula (182)
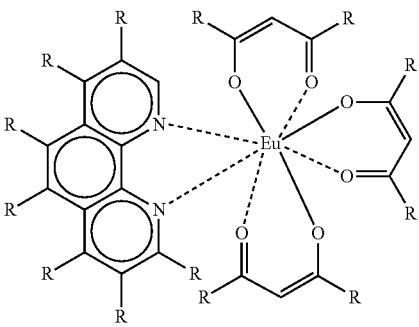

-continued

Formula (183)
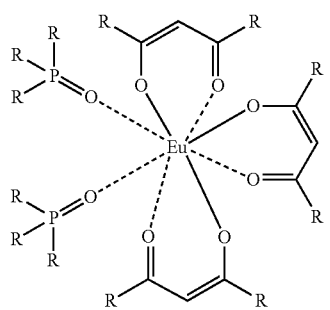

Formula (184)
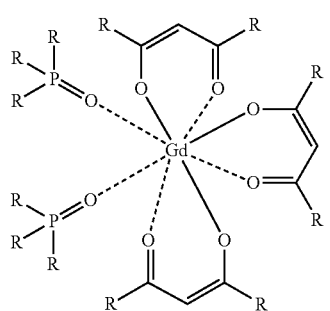

Formula (185)
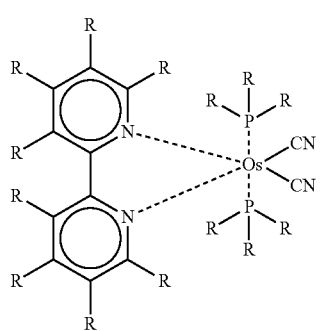

Formula (186)
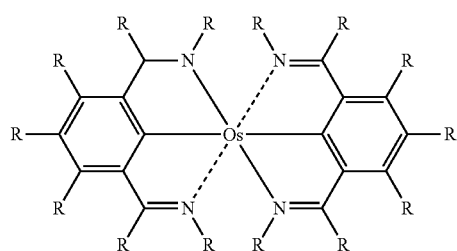

Formula (187)
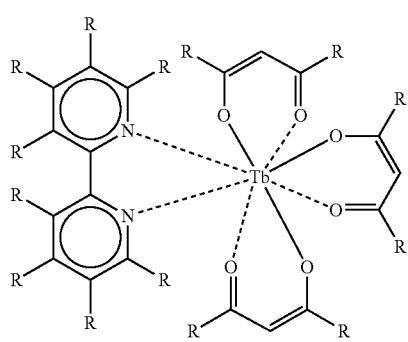

-continued

Formula (188)
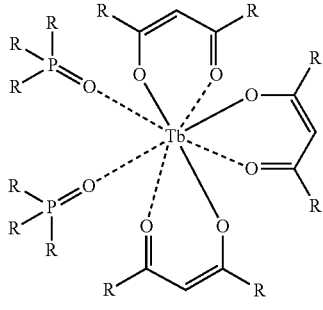

Formula (189)
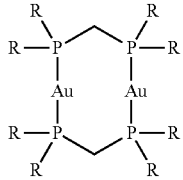

wherein R has one of the meanings of $R^1$ given above in Formula (6), and one or more, preferably one, two or three groups R, very preferably one group at one, two or three of the ligands, denotes a linkage to neighboring units in the polymer.

The organic compound according to the present invention is preferably selected of the following Formulae (190) to (193).

Formula (190)
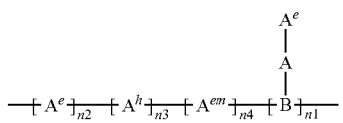

Formula (191)
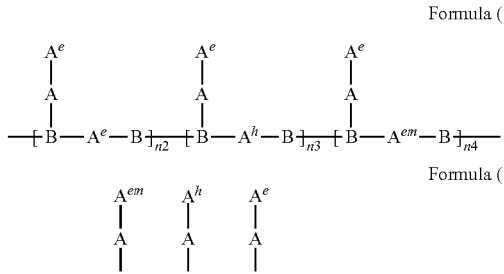

Formula (192)
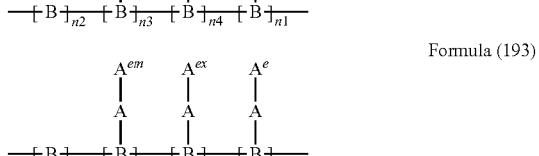

Formula (193)
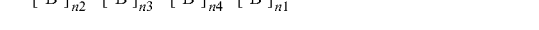

wherein
$A^e$ is an electron transporting group as defined above,
$A^{ex}$ is an exciton formation group as defined above,
$A^h$ is an hole transporting group as defined above,
$A^{em}$ is an emissive group as defined above,
B is a backbone group as defined above,
$0 > n1 < 1$,
$0 > n2 < 1$,
$0 > n3 < 1$,
$0 \leq n4 < 1$,
preferably n1>each of n2, n3 and n4, and
preferably n1+n2+n3+n4=1.

A$^{ex}$ may additionally have emissive property. A$^{em}$ may additionally have exciton formation property. Preferably the groups A$^e$, A$^{ex}$, A$^{em}$ and B are selected from compounds of Formulae (6) to (148) as indicated above. Further preferably the groups A$^{em}$ are selected from Formulae (157) to (162).

In addition to the groups disclosed above, the compounds of the present invention may comprise one or more units which are typically used as backbone units or as blue emitters in light-emitting polymers. These are generally units which comprise at least one aromatic or otherwise conjugated group, but do not shift the emission wavelength into green or red. Preferred are aromatic groups having 4 to 40 C atoms (but also stilbene or tolane derivatives, and some bis(styrene) arylene derivatives) including, but not limited to, substituted or unsubstituted 1,4-phenylene, 1,4-naphthylene, 1,4- or 9,10-anthracenylene, 2,7- or 3,6-phenanthrenylene, 4,4'-biphenylene, 4,4"-terphenylene, 4,4'-bi-1,1'-naphthylene, 4,4'-stilbene, 4,5-dihydropyrene derivatives, 4,5,9,10-tetrahydropyrenes derivatives (e.g. as disclosed in EP 0 699 699), fluorene derivatives (e.g. as disclosed in EP 0 842 208, WO 99/54385, WO 00/22027, WO 00/22026, WO 00/46321), spirobifluorene derivatives (e.g. as disclosed in EP 0 707 020, EP 0 894 107, WO 03/020790, WO 02/077060) and 5,7 dihydrodibenzoxepine derivatives, furthermore so-called "Ladder-PPPs" (LPPP) (e.g. as disclosed in WO 92/18552), and PPPS containing ansa structures (e.g. as disclosed in EP 0 690 086).

In a further preferred embodiment of the present invention compound comprises one or more identical or different exciton formation units (dyes), which upon absorbing photons, for example from sun light, form excitons, which further dissociate by transferring holes to hole transport unit and electrons to the electron transporting unit in the same compound or the adjacent another compound. Preferred groups of this type are, perylene derivates as disclosed for example in Angew. Chem. Int. Ed. 2006, 45, 3364-3368, and Ruthenium dyes and their derivatives, as disclosed for example in Nature 1991, 353, pp 737 and Angew. Chem. Int. Ed. 2005, 44, 5740-5744.

The polymers and oligomers of the present invention may be statistical or random copolymers, alternating or regioregular copolymers, block copolymers or combinations thereof. They may comprise two, three or more distinct monomer units.

The polymers and oligomers of the present invention may be prepared by any suitable method. For example, they can be suitably prepared by aryl-aryl coupling reactions, such as Yamamoto coupling, Suzuki coupling, Stille coupling, Sonogashira coupling or Heck coupling. Suzuki coupling and Yamamoto coupling are especially preferred.

The monomers which are polymerized to form the repeat units of the polymers of the present invention can be prepared according to suitable methods which are known to the expert and have been disclosed in the literature. Suitable and preferred methods for the preparation of the indenofluorene monomers of Formula (6) are described for example in WO 2004/041901. Suitable and preferred methods for the preparation of the triarylamine monomers of Formula (47) are described for example in WO 99/54385. Suitable and preferred methods for the preparation of the phenanthrene monomers of Formula (5) are described for example in WO 2005/104264 A1. Suitable and preferred methods for the preparation of the vinyltriarylamine monomers of Formula (96) are described for example in DE 102005060473.

Preferably the polymers are prepared from monomers comprising one of the above mentioned groups, which are linked to two polymerisable groups P. An example for the monomers based on a backbone group according to general Formula (6) is given in the following Formula (194).

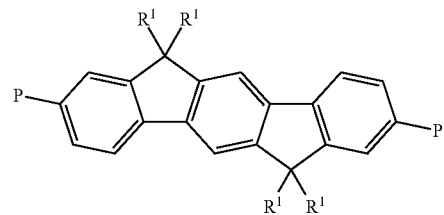

Formula (194)

wherein P is a polymerisable group and R$^1$ is as defined above in Formula (6). The monomers for the units of the other formulae disclosed above are built accordingly.

Preferably the groups P are independently of each other selected from Cl, Br, I, O-tosylate, O-triflate, O-mesylate, O-nonaflate, SiMe$_{3-z}$F$_z$ (wherein z is 1 or 2), O—SO$_2$Z, B(OZ$^1$)$_2$, —CZ$^2$=C(Z$^2$)$_2$, —C=CH and Sn(Z$^3$)$_3$, wherein Z and Z$^{1-3}$ are selected from the group consisting of alkyl and aryl, each being optionally substituted, and two groups Z$^1$ may also form a cyclic group.

Preferred methods for polymerisation are Suzuki polymerisation, as described for example in WO 00/53656, Yamamoto polymerisation, as described in for example in T. Yamamoto et al., Progress in Polymer Science 1993, 17, 1153-1205 or in WO 2004/022626 A1, and Stille coupling. For example, when synthesizing a linear polymer by Yamamoto polymerisation, a monomer as described above having two reactive halide groups P is preferably used. When synthesizing a linear polymer by Suzuki polymerisation, preferably a monomer as described above is used wherein at least one reactive group P is a boron derivative group.

Suzuki polymerisation may be used to prepare regioregular, block and random copolymers. In particular, random copolymers may be prepared from the above monomers wherein one reactive group P is halogen and the other reactive group P is a boron derivative group. Alternatively, block copolymers or alternating copolymers, in particular AB-type copolymers, may be prepared from a first and a second of the above monomers wherein both reactive groups of the first monomer are boron and both reactive groups of the second monomer are halide. The synthesis of block copolymers is described in detail for example in WO 2005/014688 A2.

It is also possible to prepare e.g. an AB-type polymer from a single monomer unit having the structure P-AB-P.

Suzuki polymerisation employs a Pd(0) complex or a Pd(II) salt. Preferred Pd(0) complexes are those bearing at least one phosphine ligand such as Pd(Ph$_3$P)$_4$. Another preferred phosphine ligand is tris(ortho-tolyl)phosphine, i.e. P(o-Tol)$_3$. Preferred Pd(II) salts include palladium acetate, i.e. Pd(OAc)$_2$. Suzuki polymerisation is performed in the presence of a base, for example sodium carbonate, potassium phosphate or an organic base such as tetraethylammonium carbonate. Yamamoto polymerisation employs a Ni(0) complex, for example bis(1,5-cyclooctadienyl) nickel(0).

As alternatives to halogens as described above, leaving groups of formula —O—SO$_2$Z can be used wherein Z is as described above. Particular examples of such leaving groups are tosylate, mesylate and triflate.

A further aspect of the present invention is an electronic or electro-optical device comprising one or more organic compounds as described above and below. A further aspect is the use of the organic compounds as described above and below in an electronic or electro-optical device. Especially preferred devices are PLEDs.

The device assembly typically consists of a substrate (like e.g. a glass sheet or a plastic foil), a first electrode, an interlayer comprising a conductive, doped polymer, a semiconductor layer according to the invention, and a second electrode. The device is patterned and provided with contacts according to the desired application and then sealed, in order to avoid contact with water and air which could drastically reduce its lifetime. It may also be preferred to use a conductive, electrically doped polymer as electrode, in which case the interlayer comprising the conductive polymer can be omitted. For use in OFETs and TFTs the device has to contain a further electrode (gate electrode) in addition to the first and second electrode (source and drain electrode). The gate electrode is separated from the organic semiconductor layer by an insulator layer comprising a dielectric material having a dielectric constant that is usually high (but in some cases may also be low). It may also be suitable that the device comprises one or more further layers depending on the desired application.

The electrodes are selected such their potential matches the potential of the adjacent organic layer, to ensure that hole or electrode injection is as efficient as possible. Preferred cathode materials are metals with low electronic work function, metal alloys or multilayered structures comprising different metals, such as alkaline earth metals, alkaline metals, main group metals or lanthanoides (e.g. Ca, Ba, Mg, Al, In, Mg, Yb, etc.). In case of multilayered structures it is also possible to use further metals in addition to the above-mentioned metals, which have a relatively high electronic work function, like e.g. Ag. In such cases normally combinations of metals are used, like e.g. Ca/Ag or Ba/Ag. It may also be preferred to apply a thin intermediate layer of a material with a high dielectric constant between the metallic cathode and the organic semiconductor. Useful materials for this purpose are e.g. alkaline or alkaline earth metal fluorides or oxides (e.g. LiF, $Li_2O$, $BaF_2$, MgO, NaF etc.). The thickness of this dielectric layer is preferably from 1 to 10 nm.

Preferred anode materials are those having a high electronic work function. Preferably the anode has a potential of more than 4.5 eV (vs. vacuum). Suitable materials for this purpose are metals having a high redox potential, like e.g. Ag, Pt or Au. It may also be preferred to use metal/metaloxide electrodes (e.g. Al/Ni/$NiO_x$, Al/Pt/$PtO_x$). For some applications at least one of the electrodes has to be transparent, in order to enable e.g. irradiation of the organic material (in OSCs) or decoupling of light (in OLEDs/PLEDs, O-LASERs). A preferred assembly comprises a transparent anode. Preferred anode materials for this purpose are conductive mixed metal oxides. Especially preferred are Indium Tin Oxide (ITO) or Indium Zinc Oxide (IZO). Further preferred are also conductive, doped organic materials, especially conductive doped polymers.

As charge injection layer on the anode a variety of doped conductive polymers can be used. Preferred polymers are those having a conductivity of $>10^{-8}$ S/cm. The potential of the layer is preferably 4 to 6 eV (vs. vacuum). The layer thickness is preferably from 10 to 500 nm, very preferably from 20 to 250 nm. Very preferably derivatives of polythiophene, like poly(3,4-ethylenedioxy-2,5-thiophene) (PEDOT) and polyaniline (PANI) are used. Doping is usually carried out with acids or oxidative agents. Preferably doping is carried out with polymeric or polymer bound Brönsted acids. Preferred materials for this purpose are polymeric sulfonic acids, especially polystyrene sulfonic acid, polyvinyl sulfonic acid and poly-(2-acrylamido-2-methyl-propane sulfonic acid) (PAMPSA). The conductive polymer is usually applied as an aqueous solution or dispersion and is insoluble in organic solvents, which allows applying the subsequent layer from organic solution.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, trifluoromethyl, perfluoro-n-butyl, 2,2,2-trifluoroethyl, perfluorooctyl, perfluorohexyl and related groups.

Unless stated otherwise, groups or indices like $Ar^1$, $R^1$, a etc. in case of multiple occurrence are selected independently from each other and may be identical or different from each other. Thus, several different groups might be represented by a single label like "$R^1$".

Most preferably, there are at least two adjacent saturated bonds along the main chain of A.

It is preferred that A is optionally fluorinated, linear or branched alkylene or alkoxylene with 1 to 12 C atoms.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy and related groups.

The term "aryl" or "arylene" means an aromatic hydrocarbon group or a group derived from an aromatic hydrocarbon group. The term "heteroaryl" or "heteroarylene" means an "aryl" or "arylene" group comprising one or more hetero atoms. The terms "alkyl", "aryl", "heteroaryl" or other related terms also include multivalent species, for example "alkylene", "arylene" or "heteroarylene".

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is substantially conjugated over substantially the whole group.

Preferred aryl groups include, without limitation, benzene, biphenylene, triphenylene, [1,1':3',1"]terphenyl-2'-ylene, naphthalene, anthracene, binaphthylene, phenanthrene, pyrene, dihydropyrene, chrysene, perylene, tetracene, pentacene, benzpyrene, fluorene, indene, indenofluorene, spirobifluorene and related groups.

Preferred heteroaryl groups include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like carbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzouran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiohene, dithienothiophene, dithienopyridine, isobenzothiophene, dibenzohiophene, benzothiadiazothiophene, or combinations thereof. The heteroryl groups may be substituted with alkyl, alkoxy, thioalkyl, fluoro, fluoroalkyl or further aryl or heteroaryl substituents.

Preferred arylalkyl groups include, without limitation, 2-tolyl, 3-tolyl, 4-tolyl, 2,6-dimethylphenyl, 2,6-diethylphenyl, 2,6-di-1-propylphenyl, 2,6-di-t-butylhenyl, o-t-butylphenyl, m-t-butylphenyl, p-t-butylphenyl, 4-phenoxyhenyl, 4-fluorophenyl, 3-carbomethoxyphenyl, 4-carbomethoxyphenyl.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy.

The aryl, heteroaryl, carbyl and hydrocarbyl groups optionally comprise one or more substituents, preferably selected from silyl, sulpho, sulphonyl, formyl, amino, imino, nitrilo, mercapto, cyano, nitro, halogen, $C_{1-12}$ alkyl, $C_{6-12}$ aryl, $C_{1-12}$ alkoxy, hydroxy and/or combinations thereof. The optional substituents may comprise all chemically possible combinations in the same group and/or a plurality (preferably two) of the aforementioned groups (for example amino and sulphonyl if directly attached to each other represent a sulphamoyl radical).

Preferred substituents include, without limitation, solubilising groups such as alkyl or alkoxy, electron withdrawing groups such as fluorine, nitro or cyano, and substituents for increasing glass transition temperature of the polymer such as bulky groups, e.g. t.-butyl or optionally substituted aryl.

Preferred substituents include, without limitation, F, Cl, Br, I, —CN, —NO$_2$, —NCO, —NCS, —OCN, —SCN, —C(=O)NR$^0$R$^{00}$, —C(=O)X$^0$, —C(=O)R$^0$, —NR$^0$R$^{00}$, optionally substituted silyl, aryl or heteroaryl with 4 to 40, preferably 6 to 20 C atoms, and straight chain or branched alkyl, alkoxy, alkylcarbonyl, alkoxycarbonyl, alkylcarbonlyoxy or alkoxycarbonyloxy with 1 to 20, preferably 1 to 12 C atoms, wherein one or more H atoms are optionally replaced by F or Cl, wherein R$^0$ and R$^{00}$ are as defined above and X$^0$ is halogen.

Most preferably, A is ethylene or difluoroethylene.

Preferably, the unit of Formula (2) is integrated into an at least partially conjugated copolymer or oligomer.

It is preferred that in the copolymer or oligomer comprising the unit of formula I, Ar$_2$ is selected from one of the following electron transporting groups: derivatives of anthracene, of binaphthyl-anthracene, of phenanthrene, of fluorene, or of indenofluorene.

Preferably, the excitation formation group is an emissive unit and also preferably, the compound is an emissive material.

It is further preferred that the compound is a charge transport material.

Preferably, Ar$^1$ or Ar$^2$ or Ar$^3$ is selected from identical or different groups of ETM or backbone groups, for example a backbone group according to Formula (6) or (18) or (21).

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The terms "hydrocarbon group", or "hydrocarbyl group" denote a carbyl group that does additionally contain one or more H atoms and optionally contains one or more hetero atoms like for example N, O, S, P, Si, Se, As, Te or Ge.

A carbyl or hydrocarbyl group containing a chain of 3 or more C atoms may be linear, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryl, arylalkyl, alkylaryloxy, arylalkyloxy arylcarbonyl, aryloxycarbonyl, arylcarbonyloxy and aryloxycarbonyloxy, each of which is optionally substituted and has 6 to 40, preferably 6 to 25 C atoms.

The carbyl or hydrocarbyl group may be a saturated or unsaturated acyclic group, or a saturated or unsaturated cyclic group. Unsaturated acyclic or cyclic groups are preferred, especially alkenyl and alkinyl groups (especially ethinyl). Where the $C_1$-$C_{40}$ carbyl or hydrocarbyl group is acyclic, the group may be linear or branched.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl and related groups Preferred alkinyl groups include, without limitation, ethinyl, propinyl, butinyl, pentinyl, hexinyl, octinyl and related groups.

The $C_1$-$C_{40}$ carbyl or hydrocarbyl group includes for example: $C_1$-$C_{40}$ alkyl, $C_2$-$C_{40}$ alkenyl, $C_2$-$C_{40}$ alkinyl, $C_3$-$C_{40}$ allyl group, $C_4$-$C_{40}$ alkyldienyl, $C_4$-$C_{40}$ polyenyl, $C_6$-$C_{40}$ aryl, $C_6$-$C_{40}$ aryloxy, $C_6$-$C_{40}$ alkylaryl, $C_6$-$C_{40}$ arylalkyl, $C_6$-$C_{40}$ alkylaryloxy, $C_6$-$C_{40}$ arylalkyloxy, $C_6$-$C_{40}$ heteroaryl, $C_4$-$C_{40}$ cycloalkyl, $C_4$-$C_{40}$ cycloalkenyl, and the like. Very preferred are $C_1$-$C_{20}$ alkyl, $C_2$-$C_{20}$ alkenyl, $C_2$-$C_{20}$ alkinyl, $C_3$-$C_{20}$ allyl, $C_4$-$C_{20}$ alkyldienyl, $C_6$-$C_{12}$ aryl, $C_6$-$C_{20}$ arylalkyl and $C_6$-$C_{20}$ heteroaryl.

Further preferred carbyl and hydrocarbyl groups include straight-chain, branched or cyclic alkyl with 1 to 40, preferably 1 to 25 C-atoms, which is unsubstituted, mono- or polysubstituted by F, Cl, Br, I or CN, and wherein one or more non-adjacent CH$_2$ groups are optionally replaced, in each case independently from one another, by —O—, —S—, —NH—, —NR$^0$—, —SiR$^0$R$^{00}$—, —CO—, —COO—, —OCO—, —O—CO—O—, —S—CO—, —CO—S—, —CO—NR$^0$—, —NR$^0$—CO—, —NR$^0$—CO—NR$^{00}$—, —CY$^1$=CY$^2$— or —C≡C— in such a manner that O and/or S atoms are not linked directly to one another, wherein Y$^1$ and Y$^2$ are independently of each other H, F, Cl or CN, and R$^0$ and R$^{00}$ are independently of each other H or an optionally substituted aliphatic or aromatic hydrocarbon with 1 to 20 C atoms.

R$^0$ and R$^{00}$ are preferably selected from H, straight-chain or branched alkyl with 1 to 12 C atoms or aryl with 6 to 12 C atoms.

It is further preferred that Ar$^1$ or Ar$^2$ or Ar$^3$ is selected from one or more identical or different HTM groups, for example Formula (47).

Preferably, Ar$_1$ or Ar$_2$ or Ar$_3$ is selected from one or more identical or different emitter groups, for example of Formula (96) and (108).

Preferred is the use of a compound according to the invention as an electronic or opto-electronic device, in particular in light emitting diodes (OLEDs).

It is preferred that the electronic or optoelectronic device, in particular an OLED, comprises a compound according to the invention.

The electronic or opto-electronic device according to the invention is preferably a conductive polymer layer and/or a hole transporting layer, and the organic compound is coated directly onto said conductive polymer and/or hole transport layer.

Preferably, the invention further relates to an opto-electronic device consisting of an anode, a cathode, a semiconductor or an emissive layer containing a compound as described in this invention, and an interlayer containing a material having hole transporting and electron blocking properties provided between the anode and the semiconductor or emissive layer.

The electronic or opto-electronic or spintronic device is preferably a light emitting diode (OLED), an organic field effect transistor (OFET), a thin film transistor (TFT), an organic solar cell (O-SC), an organic laser diode (G-laser), an organic integrated circuit (O-IC), a radio frequency identification (RFID) tag, a photodetector, a sensor, a logic circuit, a memory element, a capacitor, a charge injection layer, a Schottky diode, a planarising layer, an antistatic film, a conducting substrate or a conducting pattern, a photoconductor, an electrophotographic element, an organic light emitting transistor (OLET) or an organic spin-valve.

Preference is given to said polymer or oligomer of the present invention preferably comprises a conjugated hole transporting main chain, and at least one HTM on side chain. Further preferably, the said side chain HTM has a HOMO, whose difference to the HOMO of the main chain is less than 0.2 eV, more preferably less then 0.1 eV, particularly preferably less than 0.05 eV. The polymer or oligomer has preferably a general Formulae (5) or (4), wherein $Ar^2$ is a HTM, and x may range from 0.01 to 0.9, and preferably from 0.1 to 0.5, and more preferably from 0.15 to 0.4, and particularly preferably from 0.15 to 0.3. The polymer or oligomer according to this preferred embodiment may be particularly suitable as active polymer for OFETs.

Preference is given to said polymer of the present invention comprising a conjugated electron transporting main chain, and at least a unit $A^{ex}$ (proposed exiton formation unit) on side chain, wherein the said side unit $A^{ex}$ has a HOMO, which is at least 0.3 eV, more preferably 0.4 eV, particularly preferably 0.5 eV higher than the HOMO of the main chain. The polymer or oligomer has preferably a general formulae (5) or (4), wherein $Ar^2$ is a unit $A^{ex}$ having exciton formation property, and x may range from 0.001 to 0.2, and preferably from 0.005 to 0.1, and more preferably from 0.01 to 0.05, and particularly preferably from 0.01 to 0.04.

Further preference is given to said polymer of the present invention comprising a conjugated electron transporting main chain, and at least one HTM, wherein the said side chain HTM has a HOMO, which is at least 0.3 eV, more preferably 0.4 eV, particularly preferably 0.5 eV higher than the HOMO of the main chain. The polymer or oligomer has preferably a general Formulae (5) or (4), wherein $Ar^2$ is a HTM having hole transport property, and x may range from 0.05 to 0.6, and preferably from 0.05 to 0.4, and more preferably from 0.1 to 0.3, and particularly preferably from 0.1 to 0.25.

Yet another preference is given to said polymer of the present invention comprising a conjugated main chain, and at least one emitter group on the side-chain.

It is preferred that the opto-electronic device contains, in the following order:
a first substrate,
an anode layer,
optionally a hole injection layer,
optionally hole transport layer or an interlayer
a layer having emissive function or charge separation function
optionally an electron transport layer,
optionally an electron injection layer,
a cathode layer,
optionally a second substrate,
wherein at least one of the organic layer comprising a compound according the present invention.

It is preferred, as reported by Z. H. Xiong et al., in Nature 2004 Vol 427 pp 821, that a spin-valve device comprises two ferromagnetic electrodes and an organic layer between the two ferromagnetic electrodes, wherein at least one of the organic layers comprising a compound according the present invention and the ferromagnetic electrode is composed of Co, Ni, Fe, or alloys thereof, or $ReMnO_3$ or $CrO_2$, wherein Re is rare earth element.

Typically, the compound is coated on a device structure which consists of ITO-coated glass which was covered by a layer of conductive polymer. The thickness of the conductive polymer can vary between 10 and 200 nm depending on ITO-roughness. The compound is then coated from solution onto the conductive polymer in a thickness varying from 20 to 120 nm, preferably from 60 to 100 nm. Typically, the conductive polymer and the compound is baked after coating to remove rest of solvents (water and organic solvent) for a certain period of time. Baking temperatures vary from the polymers used and are typically in the range of 100 to 200° C. for 1 to 120 minutes, preferably 130 to 200° C. for 1 to 60 minutes and most preferably 150 to 180° C. for 10 to 30 minutes.

After coating the cathode on top of the blend, the device is typically covered by a lid to avoid penetration of moisture and oxygen.

In another embodiment of this invention the compound can also be coated onto an interlayer. In this case the interlayer polymer is coated from organic solution onto the conductive polymer and the film is heated at elevated temperature to form an interlayer. Then, non-solidified residues of the interlayer are washed away with the organic solvent and the blend is coated directly onto the deposited interlayer. Alternatively, the organic compound can also be directly coating onto the interlayer. After coating the compound, a heating procedure as described above is applied again.

The electronic or opto-electronic device can also be for example an organic field effect transistor (OFET), thin film transistor (TFT), organic solar cell (O-SC), organic laser diode (O-laser), organic integrated circuit (O-IC), radio frequency identification (RFID) tag, photodetector, sensor, logic circuit, memory element, capacitor, charge injection layer, Schottky diode, planarising layer, antistatic film, conducting substrate or pattern, photoconductor, electrophotographic element, or organic light emitting transistor (OLET).

Another aspect of the invention relates to a solution comprising one or more organic compounds as described above and below and one or more organic solvents.

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and/or mixtures thereof.

The concentration of the polymers in the solution is preferably 0.1 to 10% by weight, more preferably 0.5 to 5% by weight. Optionally, the solution also comprises one or more binders to adjust the rheological properties, as described in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

It is desirable to generate small structures or patterns in modern micro-electronics to reduce cost (more devices/unit area), and power consumption. Patterning of the layer of the invention may be carried out for example by photolithography or electron beam lithography.

For use as thin layers in electronic or opto-electronic devices the organic compound or solutions of the present invention may be deposited by any suitable method. Liquid coating of devices such OLEDs is more desirable than vacuum deposition techniques. Solution deposition methods are especially preferred. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution displays to be prepared.

Selected solutions of the present invention may be applied to prefabricated device substrates by ink jet printing or microdispensing. Preferably Industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the organic compounds should be first dissolved in a suitable solvent. Solvents must fulfil the requirements stated above and must not have any detrimental effect on the chosen print head. Additionally, solvents should have boiling points larger than 100° C., preferably larger than 140° C. and more preferably larger than 150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, which is a combination of two or more solvents, each solvent preferably having a boiling point larger than 100° C., more preferably larger than 140° C. Such solvent(s) also enhance film formation in the layer deposited and reduce defects in the layer.

The ink jet fluid (that is mixture of solvent, binder and semiconducting compound) preferably has a viscosity at 20° C. of 1 to 100 mPa·s, more preferably 1 to 50 mPa·s and most preferably 1 to 30 mPa·s.

The organic compounds or solutions according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, or inhibitors.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

WORKING EXAMPLES
Example 1
Quantum Chemical Simulations on Backbone Units with Host Groups as Side Chains
The backbones PN0 and MIF0 are functionalised by electron-transport group Sub1 and Sub2 through a spacer —$CH_2CH_2$— (herein shown as C—C) in order to get MIF1, MIF2, and PN1.
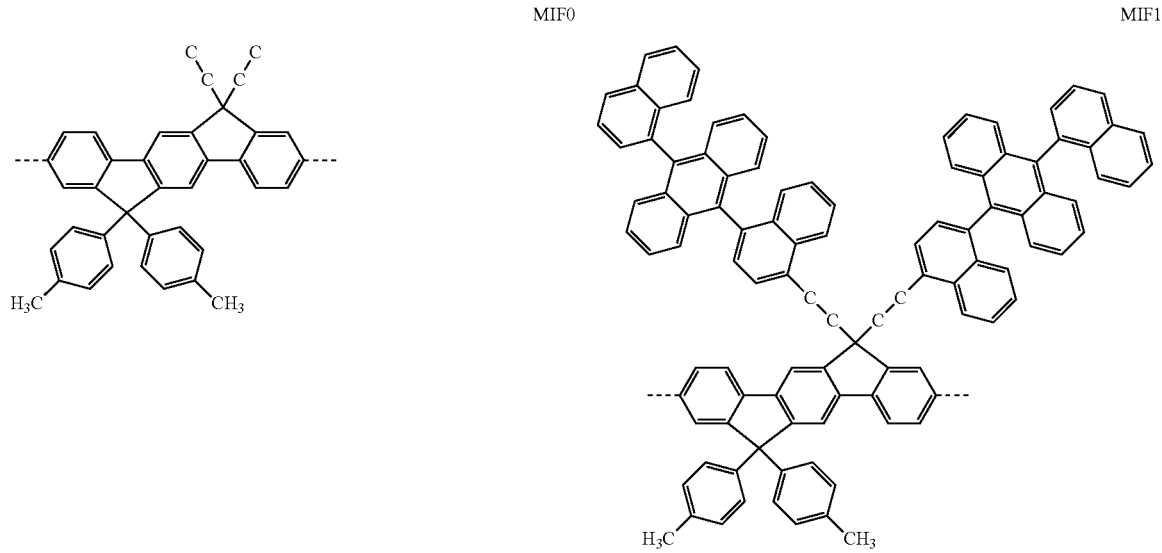
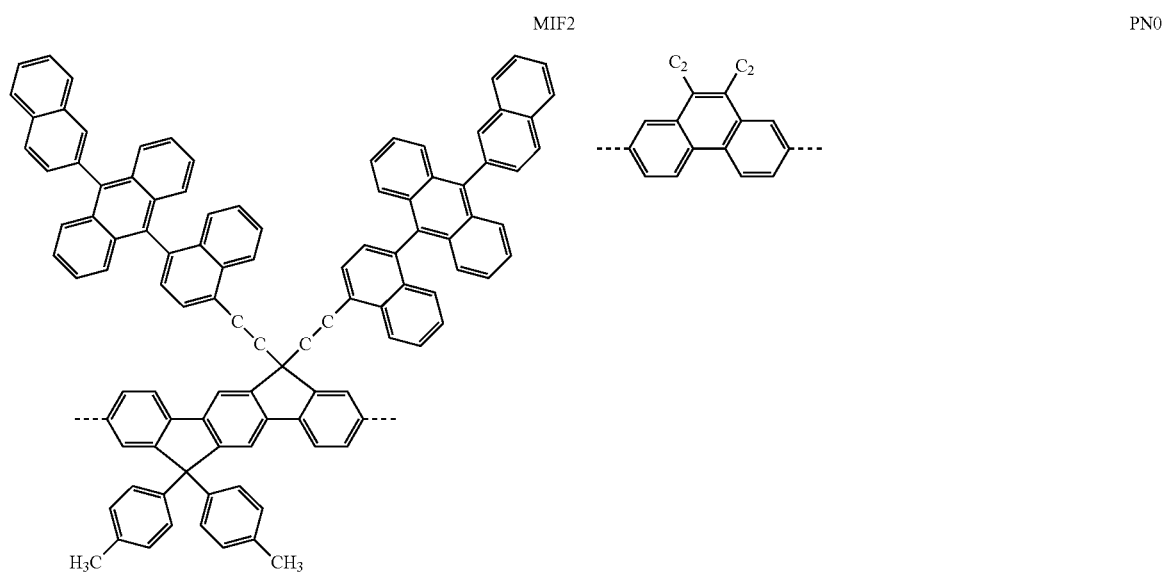

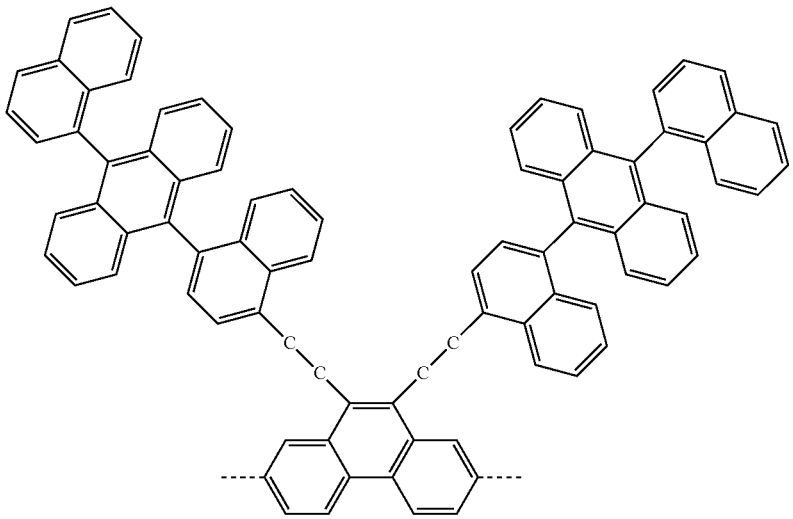

PN1

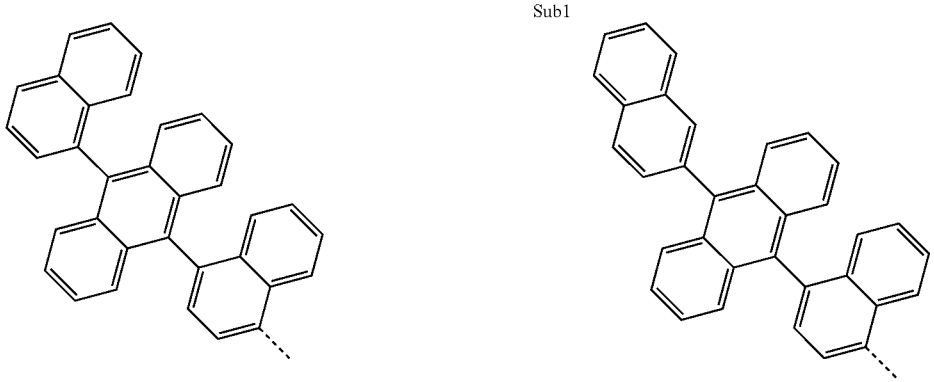

Sub1　　　Sub2 wherein the dotted line indicates the binding position.

The quantum simulations on organic functional materials are conducted in Gaussian 03W (Gaussian Inc.). For organic compounds comprising no metal, at first AM1 (Austin Model 1) is used to optimise the molecular geometry, and TD-DFT (time-dependent density functional theory) with correction functional B3PW91 and basis set 6-31G(d) is used for energy calculations. The calculations give HOMO/LUMO (highest occupied molecular orbital/lowest unoccupied molecular orbital) levels and energies for triplet and singlet excited states. The HOMO and LUMO are corrected by cyclic voltammetry (CV) as follows: a set of materials are measured by CV and also calculated by the methods mentioned above. The calculated values are then calibrated according to the measured values. Such calibration factor is used for further calculation. From the energy calculation one gets HOMO HEh and LUMO HEh in Hartree units. And the HOMO and LUMO values in electron volts is determined with following equations, which are resulted from the calibration using CV measurements.

$$HOMO(eV) = ((HEh*27.212) - 0.9899)/1.1206$$

$$LUMO(eV) = ((LEh*27.212) - 2.0041)/1.385$$

These values will be used as HOMO/LUMO levels of the compounds in the present invention. For polymers, especially conjugated polymers, trimers of the polymer are calculated. For example, for a polymer polymeriszed by monomer M9 and M11, the timers M9-M11-M9 and/or M11-M9-M11 are used in calculation, wherein the polymisable groups are removed and the long alkyl chains are reduced to methyl chain (see bellow). The agreement between measurements and simulations on polymers can be referred to WO 2008/011953 A1 and be also seen in the following with the comparison of CV measurements and DFT calculations.

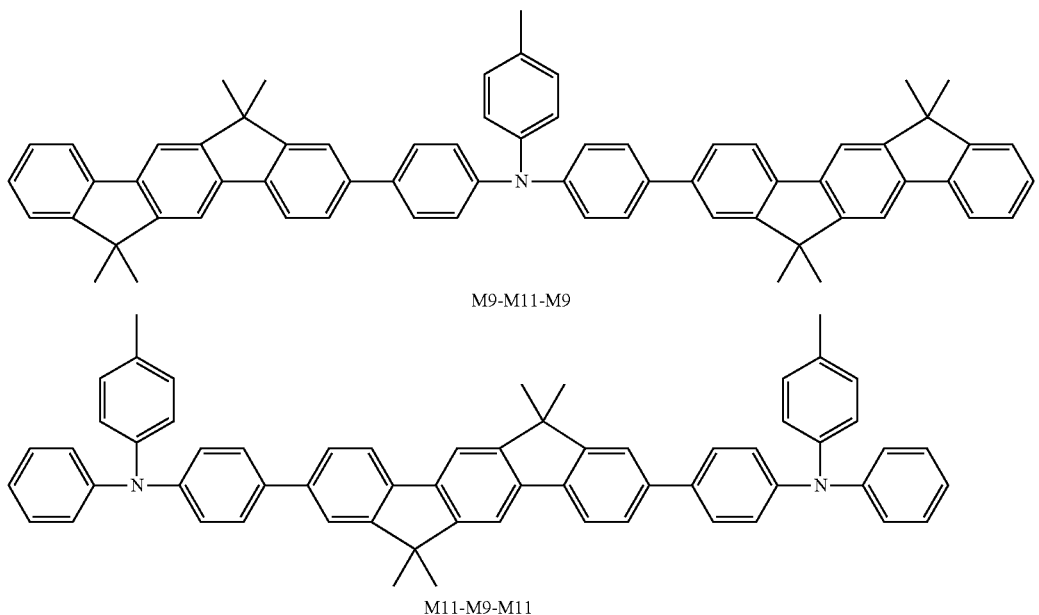

M9-M11-M9

M11-M9-M11

The quantum chemical simulations on the above-mentioned functionalised backbones (MIF1, MIF2, PN1) are conducted in monomer and trimers using PN0 or MIF0 as mixed backbones, and shows an very good energetic isolation of the functional side group, Sub1 and Sub2 from the conjugated backbone. This helps to increase the volume of active materials, and also an ease and flexibility in material design. The conformation of the trimers further indicates a possible good solubility.

TABLE 1

Simulations on MIF1

| Unit | HOMO Corrected | HOMO Position | LUMO Corrected | LUMO Position |
|---|---|---|---|---|
| Sub1 | −5.4 | | −2.6 | |
| MIF0 | −5.8 | | −2.3 | |
| MIF1_1 | −5.4 | Sub1 | −2.6 | Sub1 |
| MIF1_2 | −5.4 | Sub1 | −2.6 | Sub1 |
| MIF1_3 | −5.9 | MIF0 | −2.4 | MIF0 |
| PN0-MIF1-PN0_1 | −5.40 | Sub1 | −2.6 | Sub1 |
| PN0-MIF1-PN0_2 | −5.44 | Sub1 | −2.6 | MIF0 |
| PN0-MIF1-PN0_3 | −5.66 | MIF0 | −2.6 | Sub1 |

*In MIF1_n and PN0-MIF1-PN0_n, the n relates to the molecular orbital with n = 1(HOMO/LUMO), n = 2 (HOMO − 1/LUMO + 1) and n = 3 (HOMO − 2/LUMO + 2). For example the row "MIF1_2" corresponds to the second highest occupied, i.e. to the molecular orbital HOMO − 2, and the second lowest unoccupied molecular orbital, i.e to the molecular orbital LUMO + 2.

The columns HOMO and LUMO position in Table 1 explain the localisation of the orbitals. Thus, a HOMO position of MIF1_1 on Sub1 means that the HOMO of the molecule MIF1_1 is mainly localized on Sub1. As shown in Table 1, the quantum simulations on both MIF1 monomer and trimer with PN0 show that there are isolated molecule orbitals (both occupied or unoccupied) on the Sub1 side-chain with almost identical energy level as group Sub1 alone, indicative of an excellent isolation could be achieved between backbone and functional side chain through a short non-conjugated spacer —CH$_2$CH$_2$—. It should be pointed out that in trimer configuration, a conjugated segment in polymer, the two side chains Sub1 share almost the same LUMO level (−2.6 eV) with the backbone. It could be very helpful for electron transport, because it increases the density of state in the electron transport channel yet keeping low energy disorder. The structure received by the simulations clearly indicate to be beneficial for solubility.

The excellent agreement between simulation and CV measurements can be referred to WO 2008/011952.

TABLE 2

Simulations on MIF2

| Unit | HOMO Corrected | HOMO Position | LUMO Corrected | LUMO Position |
|---|---|---|---|---|
| Sub2 | −5.4 | | −2.6 | |
| MIF0 | −5.8 | | −2.3 | |
| MIF2_0 | −5.4 | Sub2 | −2.6 | Sub2 |
| MIF2_1 | −5.4 | Sub2 | −2.6 | Sub2 |
| MIF2_2 | −5.9 | MIF0 | −2.4 | MIF0 |
| PN0-MIF2-PN0_0 | −5.4 | Sub2 | −2.6 | Sub2 |
| PN0-MIF2-PN0_1 | −5.4 | Sub2 | −2.6 | Sub2 |
| PN0-MIF2-PN0_2 | −5.6 | MIF0 | −2.6 | MIF0 |

Table 2 shows the quantum simulations for both MIF2 monomer and timer with PN0. The results clearly show that there are isolated molecule orbitals (both occupied and unoccupied) on the Sub2 side-chain with almost identical energy level as group Sub2 alone. Thus, by employing a short non-conjugated spacer like —CH$_2$CH$_2$— between the backbone and the functional side chain an excellent isolation can be achieved. In analogy to the results with MIF1, the LUMO level (−2.6 eV) of the two side chains SUB2 in PN0-MIF2-PN0 share almost the same level as the backbone LUMO. This is very helpful for electron transport, because it increases the density of state in the electron transport channel yet keeping low energy disorder. The optimised geometry also clearly shows the energetically isolation, which clearly indicates a structure which is beneficial for solubility.

Example 2

Synthesis of Monomers

Synthesis of 9,9-Bis[4-(di-p-tolyl)aminophenyl]-2,7-diiodofluorene M1

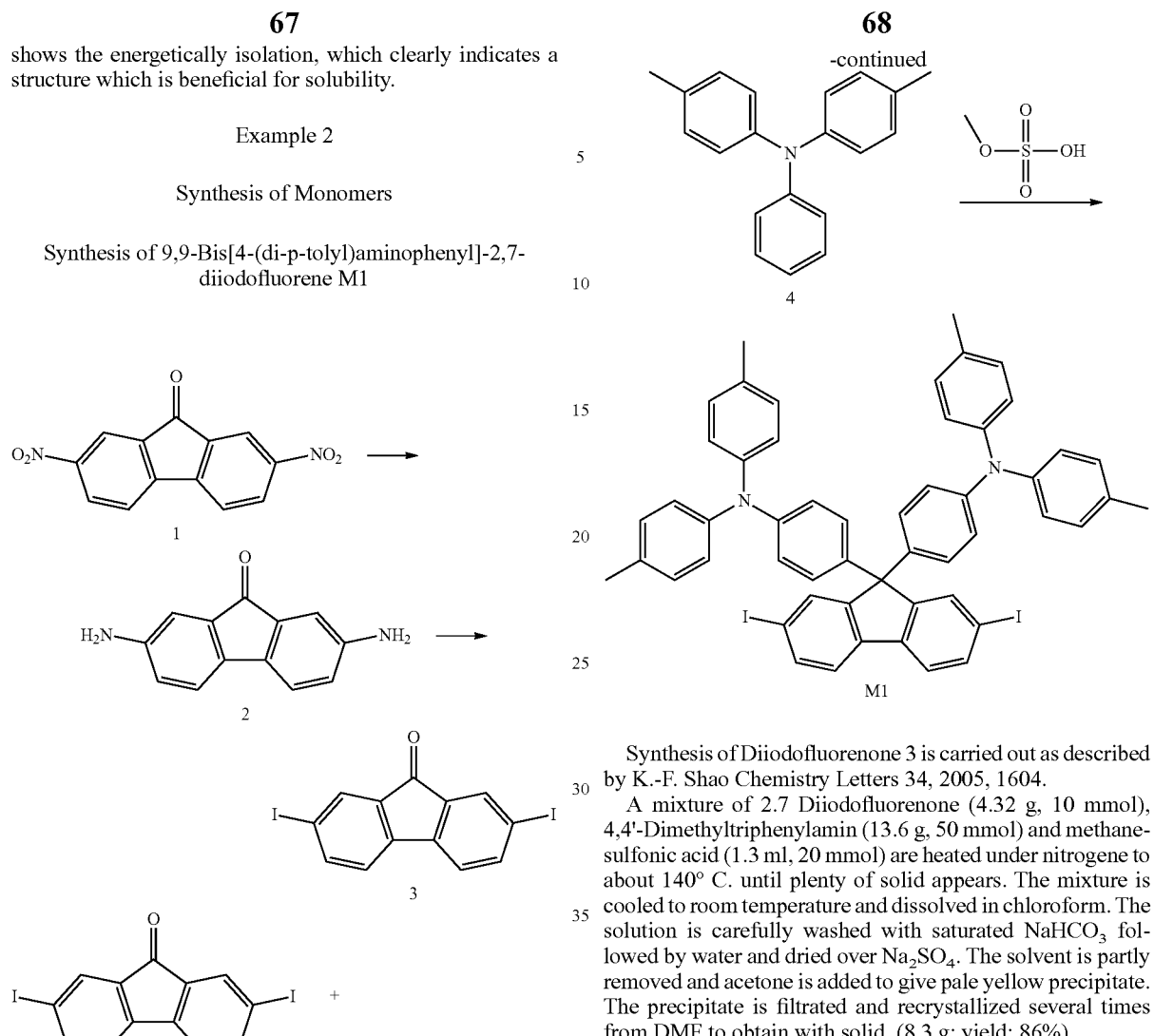

Synthesis of Diiodofluorenone 3 is carried out as described by K.-F. Shao Chemistry Letters 34, 2005, 1604.

A mixture of 2.7 Diiodofluorenone (4.32 g, 10 mmol), 4,4'-Dimethyltriphenylamin (13.6 g, 50 mmol) and methanesulfonic acid (1.3 ml, 20 mmol) are heated under nitrogene to about 140° C. until plenty of solid appears. The mixture is cooled to room temperature and dissolved in chloroform. The solution is carefully washed with saturated NaHCO$_3$ followed by water and dried over Na$_2$SO$_4$. The solvent is partly removed and acetone is added to give pale yellow precipitate. The precipitate is filtered and recrystallized several times from DMF to obtain with solid. (8.3 g; yield: 86%)

Synthesis of 9,9-Bis[4-(di-p-tolyl)-aminobiphenyl]-2,7-diiodofluorene M2

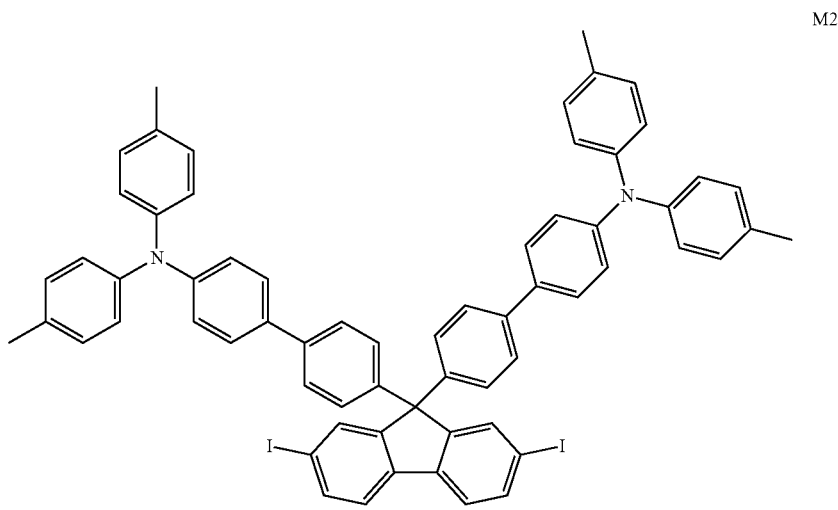

9,9-Bis[4-(di-p-tolyl)aminobiphenyl]-2,7-fluorene M2 can be synthesized in analogy to M1.
Synthesis of 9,9-Bis[bistriaylamin]-2,7-diiodofluorene M3
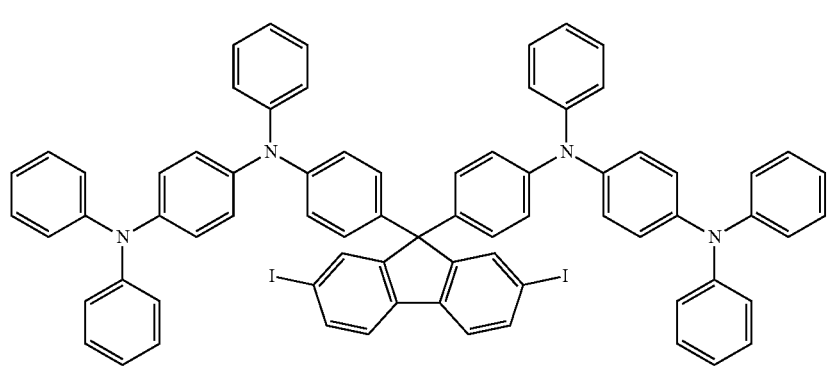
M3
M3 can be synthesized in analogy to M1.
Synthesis of Monomer M4
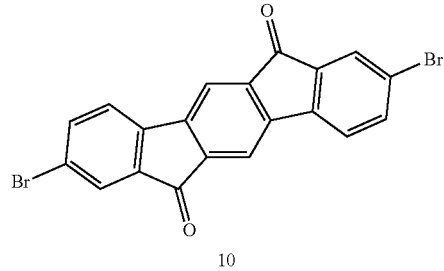
10
-continued
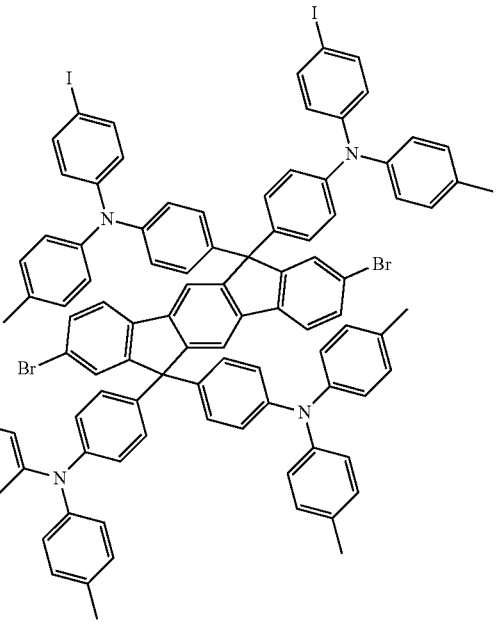
M4
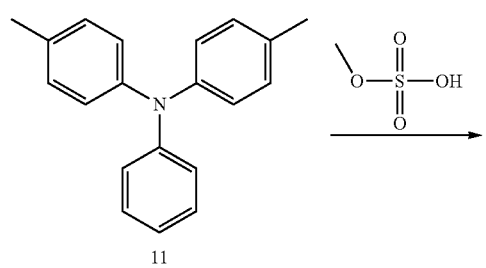 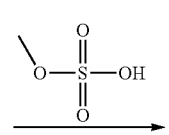
11
Synthesis of Dibromoindenofluorenone 10 can be carried in analogy to the disclosure in WO 2004041901.

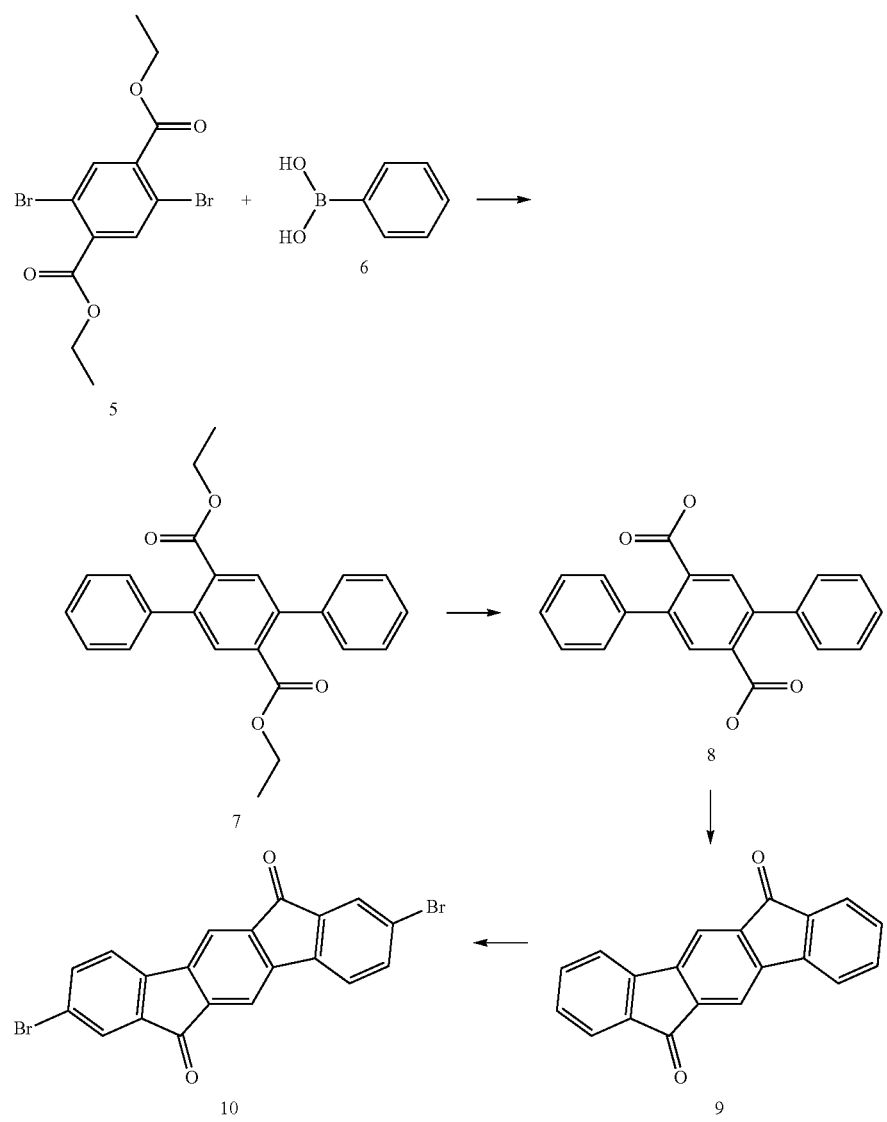
9,9'-Bis[4-(di-p-tolyl)aminobiphenyl]-2,7-indenofluorene M4 can be synthesized in analogy to M1 using 2,7-Dibromindenofluorenone as starting material.
Synthesis of Monomer M5
-continued
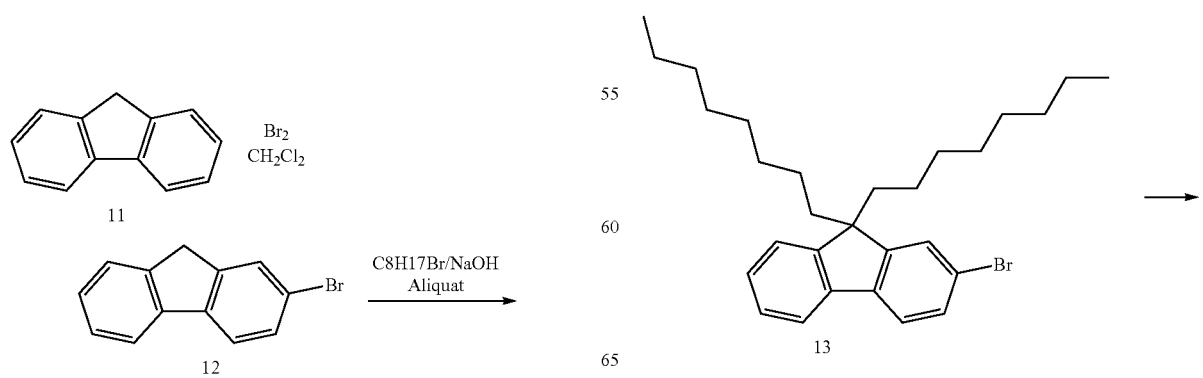

73
-continued

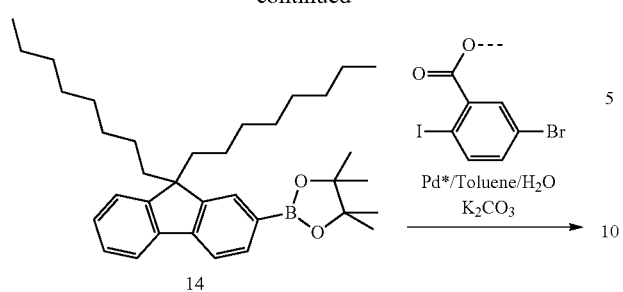

74
-continued

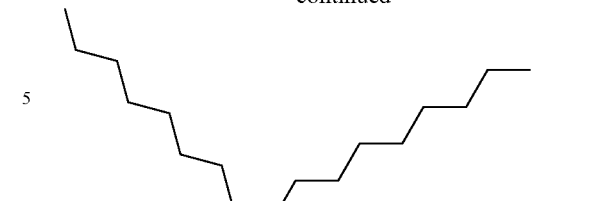

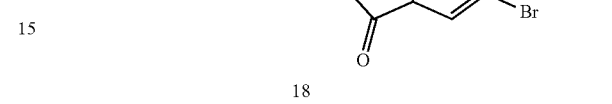

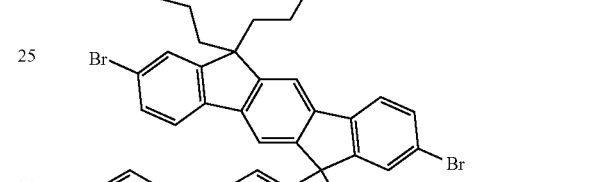

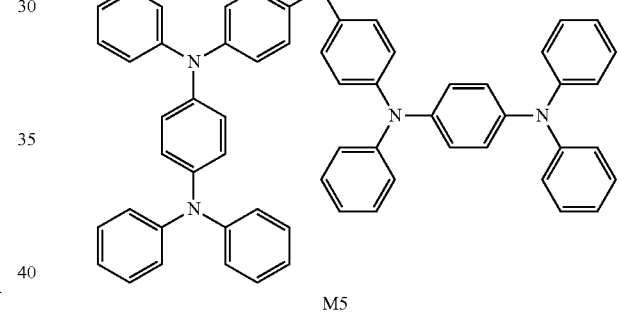

Synthesis of 5-Bromo-2-(9,9'-Dioctyl-9H-fluoren-2-yl)benzoic acid methyl ester 15

51.6 g (0.1 mol) Dioctylfluoreneboronic acid 14, 41.4 g (0.3 mol) potassium carbonate and 35.8 g (0.105 mol) 6-Iodo-3-bromomethylbenzoate are dissolved in 130 ml toluene and 130 ml $H_2O$. The solution is carefully degassed and 142 mg $Pd(PPh_3)_4$ is added. The solution is heated to reflux until the reaction is completed. The reaction mixture is cooled to room temperature and 200 ml $H_2O$ is added. The organic layer is separated and the aqueous layer is extracted with toluene. The unified organic layers are washed twice with 60 nil water dried over sodium sulfate, filtrated and the solvent is removed under vacuum. The residue is recrystallisated from butanole to result white solid (54.3 g, 0.09 mol; yield: 90%).

Synthesis of 5-Bromo-2-(7-bromo-9,9'-Dioctyl-9H-fluoren-2-yl)benzoic acid methyl ester 16

40 g (66 mmol) 15 is dissolved in 300 ml dichloromethane. The solution is cooled to 0° C., 1 g iodine is added and the mixture is stirred for 30 min. Then a solution of 11 g bromine in dichloromethane is slowly added by a dropping funnel. The

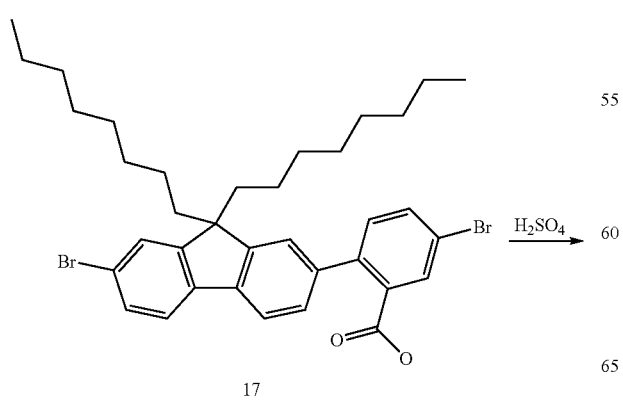

solution is heated to reflux until the reaction is completed The reaction mixture is allowed to warm up to room temperature and of a 200 ml saturated Na₂S₂O₃ solution is added. The organic layer is separated and the aqueous layer is extracted with dichloromethane. The unified organic layers are washed twice with 100 ml water dried over sodium sulfate, filtrated and the solvent is removed under vacuum. The residue is recystallisated from butanole to result white solid (38 g 55.6 mmol, yield: 84%)

Synthesis of 5-Bromo-2-(7-bromo-9,9'-Dioctyl-9H-fluoren-2-yl)benzoic acid 17

35 g (51.2 mmol) 16 is suspended in 300 ml ethanol and treated with 50 ml 50% KOH/ethanol solution and heated to reflux for 3 h. After cooling to room temperature with reaction mixture is diluted with 200 ml ethanol, with precipitation is collected by filtration, the residue is washed with ethanol and dried in vacuum. 35 g (yield: 98%) of a white solid can be obtained.

Synthesis of 2,8-Dibromo-12,12'-dioctyl-12H-indenofluoren-6-one 18

At 0° C. the potassium salt 17 is added to a well stirred sulfuric acid and continuously stirred for 3 h. To the mixture ice is carefully added and the obtained solid is collected by filtration, with residue is washed with water and ethanol and recrystallisated from DMF the give 32 g (yield: 97%) of a white powder.

Synthesis of Monomer M5

A mixture of dibromoindenofluorenone 18 (6.5 g, 10 mmol), 4,4'-tetraphenylbenzenediamine (20.6 g, 50 mmol) and methanesulfonic acid (1.3 ml, 20 mmol) is heated under nitrogene to about 140° C. until plenty of solid appears. The mixture is cooled to room temperature and dissolved in chloroform. The solution is carefully washed with saturated NaHCO₃ followed by water and dried over Na₂SO₄. The solvent is partly removed and acetone is added to give pale yellow precipitate. The precipitate is filtrated and recrystallized several times from DMF to obtain a solid (11.9 g; yield: 82%).

Further Monomers for Suzuki Polycondensation

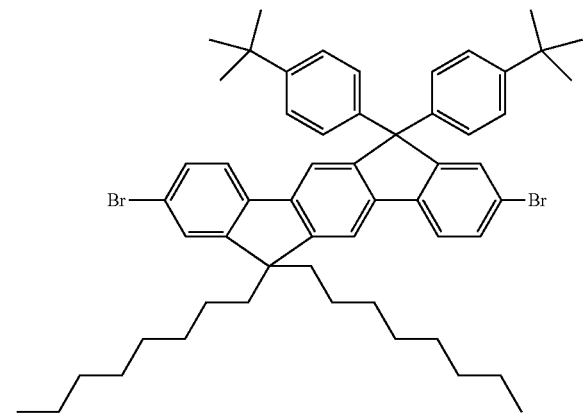
M7

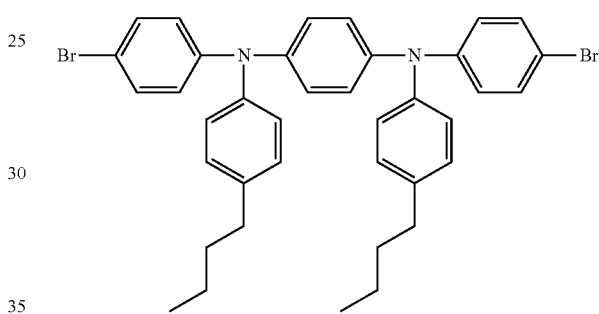
M8

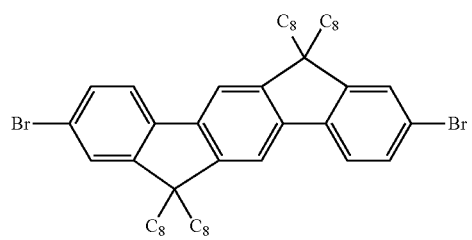
M9

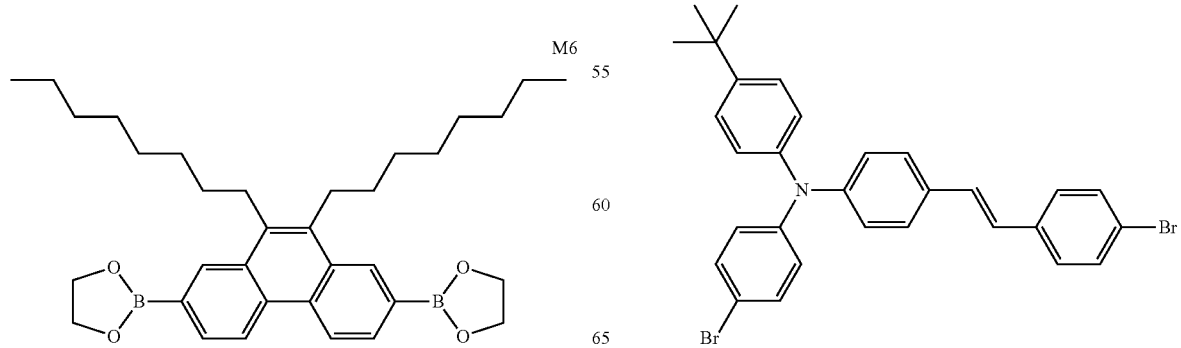
M6

M10

M11

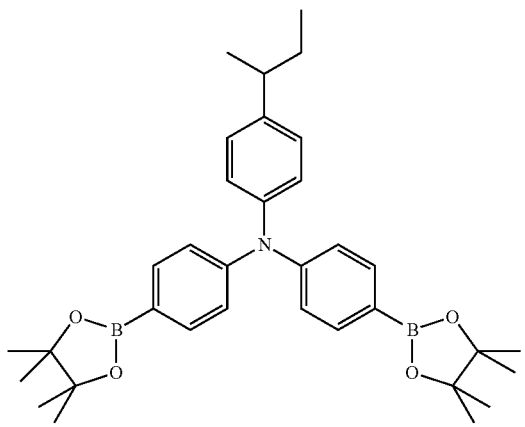

Example 3

Synthesis of Polymers P1 to P5 and V1 to V2

The polymers P1 to P5 and the reference polymers V1 to V2, can be synthesized by using the recipe as describe in WO 03/048225 A2 from the following monomer compositions in Table 3, via Suzuki-Cross-Coupling. V1, P1, P2, P3 are hole transporting conjugated polymers, and can be used as interlayer for PLED or active layer in OFET. In V1, all functional groups are on main chain, whereas in P1, P2 and P3 part of hole transport units are on the side-chain. V2, P4 and P5 are emissive conjugated polymers. In V2, all functional groups are on the main chain, whereas in P4 and P5, the supposed exciton formation units are on side chain.

TABLE 3

Polymer composition in mol %

| | M1 | M2 | M3 | M4 | M5 | M6 | M7 | M8 | M9 | M10 | M11 | Mw |
|---|---|---|---|---|---|---|---|---|---|---|---|---|
| V1 | | | | | | | | 50 | | | 50 | 213.000 |
| V2 | | | | 50 | 46 | 2 | | | 2 | | | 307.000 |
| P1 | | | 10 | | | | | | | 40 | 50 | 278.000 |
| P2 | 10 | | | | | | | | | 40 | 50 | 251.000 |
| P3 | | 10 | | | | | | | | 40 | 50 | 389.000 |
| P4 | | | | 2 | | 50 | 46 | | | | 2 | 321.000 |
| P5 | | | | | 2 | 50 | 46 | | | | 2 | 257.000 |

Example 4

Solutions S1 to S7 Comprising Polymers P1 to P5 and V1 to V2

Solutions covered by Table 4 can be obtained by the following procedure. The compositions are dissolved in 10 ml solvent and stirred to a clear solution. The solution is filtered by employing Millipore Millex LS, Hydrophobic PTFE 5.0 μm.

TABLE 4

Solutions of polymers P1 to P4 and V1 to V2

| | Composition | Solvent | Concentration | Use in Device |
|---|---|---|---|---|
| S1 | V1 | toluene | 5 mg/ml | PLEDs & OFET1 |
| S2 | V2 | toluene | 8 mg/ml | PLED1 |
| S3 | P1 | toluene | 5 mg/ml | OFET2 |
| S4 | P2 | toluene | 5 mg/ml | OFET3 |
| S5 | P3 | toluene | 5 mg/ml | OFET4 |
| S6 | P4 | toluene | 8 mg/ml | PLED2 |
| S7 | P5 | toluene | 10 mg/ml | PLED3 |

Solution S1 is used to be deposited onto the interlayer of OLEDs. Solutions S2, S6 and S7 are used in order to be deposited onto the emissive layer (EML) of OLEDs. Solutions S1, S3, S4 and S5 can also be used in order to be deposited onto the active layer of OFETs. The corresponding solid composition can be obtained by evaporating the solvent. The solid composition can further be used for the preparation of other formulations.

Example 5

Preparation of Polymer Light Emitting Diodes (PLEDs)

PLED1 to PLED3 with the standard device structure, ITO/PEDOT/Interlayer/EML/Cathode, can be prepared according to the following procedure:
1. Deposition of 80 nm PEDOT (Baytron P AI 4083) onto ITO coated glass substrate by spin coating, then heating at 120° C. for 10 min in clean room.
2. Deposition of 20 nm interlayer by spin coating solution S1 in glovebox.
3. Heating interlayer at 180° C. for 1 h in glovebox.
4. Depositing the EML layer by spin-coating solution S2 (for PLED1) or S6 (for PLED2) or S7 (for PLED3) to a thickness of 65 nm.
5. Heating the device at 180° C. for 10 min.
6. Deposition of Ba/Al cathode (3 nm/150 nm) by evaporation onto the emissive layer.
7. Encapsulation of the device.

Example 6

Measurements and Results Comparison of PLED1 to PLED3

PLED1 to PLED3 are characterized with respect to V/I/L characteristics, EL spectrum and color coordinates, efficiency, driving voltages, and lifetimes.

The results using PLED1 as control are summarized in the Table 5, wherein Uon stands for turn-on voltage, U(100) for the voltage at 100 nits, and U(1000) for the voltage at 1000 nits, and LT DC for life time at constant current. LT DC is defined as the time the luminance decays to the half if the initial luminance.

TABLE 5

Performance comparison PLED1 to PLED3

| | Max Eff. [cd/A] | U on [V] | U (100) [V] | CIE at 100 cd/m² | LT DC [hrs at nits] | |
|---|---|---|---|---|---|---|
| PLED1 | 5.82 | 2.99 | 4.48 | (0.15, 0.18) | 253 | 1000 |
| PLED2 | 5.93 | 3.01 | 4.52 | (0.15, 0.18) | 330 | 1000 |
| PLED3 | 6.12 | 3.27 | 5.42 | (0.15, 0.18) | 527 | 1000 |

As can be seen from Table 5, PLED2 and PLED 3 show increased performance as compared to PLED1 with respect to driving voltage, efficiency and lietime. The best performance is achieved by using P5 as EML (PLED3), followed by a P4 (PLED2).

Based on the present invention one skilled in the art can improve the polymers, solutions and devices in different ways by employing standard techniques without being inventive. As an example one way to further optimize the present invention is to use different polymer backbones or other emitter molecules in the same or different compositions.

Example 7

OFETs Based on V1 and P1 to P3

Thin-film bottom gate, bottom contact organic field-effect transistors (OFETs) (OFET1-4) are fabricated in a dry nitrogen glove box environment on highly doped silicon substrates with thermally grown silicon oxide (SiO$_2$) insulating layer (thickness 230 nm), where the substrate served as a common gate electrode. Transistor source-drain gold contacts are photolithographically defined on the SiO$_2$ layer. FET substrates are solvent cleaned and then ozone treated for 10 min in a custom built low-pressure mercury lamp setup. Devices are then treated with octyltrichlorosilane by immersing substrates in 10 mM solutions in heated toluene (60° C.) for 15 min, followed by a thorough washing with hexane, acetone and isopropanol. The organic semiconductor films are then deposited by spin-coating the corresponding solutions (See table 4) at a spin speed of 3,000 rpm. The samples are then dried and annealed at 100° C. for 10 min and measured in the absence of light. Field effect mobility $\mu^{sat}$ is calculated in the saturation regime ($V_d$>($V_g$−$V_o$)) using equation (1):

$$\left(\frac{dI_d^{sat}}{dV_g}\right)_{V_d} = \frac{WC_i}{L}\mu^{sat}(V_g - V_0) \tag{1}$$

where W is the channel width, L the channel length, $C_i$ the capacitance of insulating layer, $V_d$ the drain voltage, $V_g$ the gate voltage, $V_0$ the turn-on voltage and $I_d$ the drain current. Mobilities of OFET1 to OFET3 are listed in the Table 6.

TABLE 6

| Device | Mobility [cm$^2$/Vs] |
| --- | --- |
| OFET1 | 1.4 × 10$^{-5}$ |
| OFET2 | 2.0 × 10$^{-4}$ |
| OFET3 | 1.7 × 10$^{-4}$ |
| OFET4 | 8.3 × 10$^{-4}$ |

As can be seen from above Table, in comparison to OFET1, OFET2-4 show much better mobilities. The best one is achieved by using P1 as active layer, followed by a P2 and P3.

Based on the present invention one skilled in the art can improve the devices in different ways by employing standard techniques and without being inventive. As an example one way to further optimize the present invention is to use dielectric materials other than SiO$_2$.

The invention claimed is:

1. A conjugated oligomer or polymer comprising at least one unit of Formula (192)

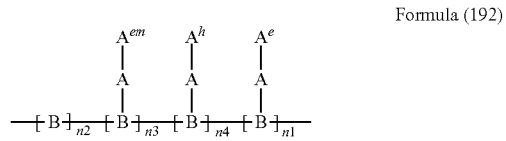

Formula (192)

where A is a spacer that is not N-substituted;
A$^e$ is an electron transporting group,
A$^h$ is an hole transporting group,
A$^{em}$ is an emissive group,
B is a backbone group,
0<n1<1,
0<n2<1,
0<n3<1 and
0≤n4<1.

2. The oligomer or polymer according to claim 1, wherein the difference between the LUMOs of the said A$^e$ and the main chain is less than 0.2 eV.

3. The oligomer or polymer according to claim 1, wherein the difference between the LUMOs of the said A$^h$ and the main chain isles than 0.2 eV.

4. The oligomer or polymer according to claim 1, wherein the HOMO of the said B is at least 0.3 eV higher that of the main chain.

5. The oligomer or polymer according to claim 1, wherein A is saturated unsubstituted or substituted alkyl, alkylsilyl, silyl, alkyloxyalkyl or alkylthioalkyl with 1 to 12 C atoms, wherein the substitution pattern is hydrogen, halogen, alkyl, heteroalkyl or cycloalkyl.

6. The oligomer or polymer according to claim 1, wherein there are at least two adjacent single bonds along the main chain of A.

7. The oligomer or polymer according to claim 1, wherein A is fluorinated, linear or branched alkylene or alkyleneoxy with 1 to 12 C atoms.

8. The oligomer or polymer according to claim 1, wherein A$^e$ is selected from one of the following electron transporting groups: imidazoles, pyridines, pyrimidines, pyridazines, pyrazines, chinolines, chinoxalines, anthracenes, benzanthracenes, pyrenes, perylenes, benzimidazoles, triazines, ketones, phosphinoxides, phenazines, phenanthrolines, triarylboranes, phenanthrenes, fluorenes, indenofluorenes, isomers and derivatives thereof.

9. The oligomer or polymer according to claim 1, wherein A$^h$ is selected from amines, triarylamines, thiophenes, carbazoles, indolocarbazoles, phthalocyanines, porphyrines, isomers and derivatives thereof.

10. The oligomer or polymer according to claim 1, wherein B is selected from identical or different groups of Formula (6)

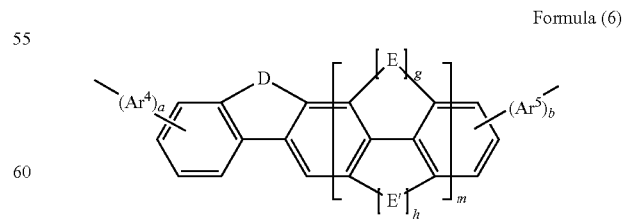

Formula (6)

wherein

D, E and E' are independently of each other, and in case of multiple occurrence independently of one another, a divalent group, selected from —CR$^1$R$^2$—, —NR$^1$—, —PR¹—, —O—, —S—, —SO—, —SO₂—, —CO—, —CS—, —CSe—, —P(═S)R¹— and —SiR¹R²—, R¹ and R² are independently of each other identical or different groups selected from H, halogen, —CN, —NC, —NCO, —NCS, —OCN, —SCN, —C(═O) NR⁰R⁰⁰, —C(═O)R⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl with 1 to 40 C atoms that is optionally substituted and optionally comprises one or more hetero atoms, and optionally the groups R¹ and R² form a Spiro group with the fluorene moiety to which they are attached, X is halogen, R⁰ and R⁰⁰ are independently of each other hydrogen, a substituted carbyl or hydrocarbyl group optionally comprising one or more hetero atoms, each g is independently 0 or 1 and each corresponding h in the same subunit is the opposite of 0 and 1, m is an integer larger than or equal to 1, Ar⁴ and Ar⁵ are independently of each other mono- or polynuclear aryl or heteroaryl that is unsubstituted or substituted and optionally fused to the 7,8-positions or 8,9-positions of the indenofluorene group, a and b are independently of each other 0 or 1.

11. The oligomer or polymer according to claim 1, wherein A^h is selected from one or more identical or different groups of Formula (47)

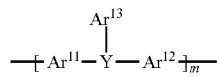

Formula (47)

wherein

Y is N, P, B, P═O, PF₂, P═S, As, As═O, As═S, Sb, Sb═O or Sb═S, Si—R¹, Ge—R¹,

R¹ is H, halogen, —CN, —NC, —NCO, —NCS, —OCN, —SCN, —C(═O)NR⁰R⁰⁰, —C(═O)X, —C(═O)R⁰, —NH₂, —NR⁰R⁰⁰, —SH, —SR⁰, —SO₃H, —SO₂R⁰, —OH, —NO₂, —CF₃, —SF₅, optionally substituted silyl, or carbyl or hydrocarbyl with 1 to 40 C atoms that is optionally substituted and optionally comprises one or more hetero atoms, and optionally the groups R¹ and R² form a spiro group with the fluorene moiety to which they are attached, X is halogen, R⁰ and R⁰⁰ are independently of each other hydrogen, a substituted carbyl or hydrocarbyl group optionally comprising one or more hetero atoms, Ar¹¹ which may be the same or different, denote, independently if in different repeat units, a single bond or an optionally substituted mononuclear or polynuclear aryl group, Ar¹² which may be the same or different, denote, independently if in different repeat units, an optionally substituted mononuclear or polynuclear aryl group, Ar¹³ which may be the same or different, denote, independently if in different repeat units, an optionally substituted mononuclear or polynuclear aryl group, which may be optionally substituted by a bridging group linking different chain residues of formula II, and m is 1, 2 or 3.

12. The oligomer or polymer according to claim 1, wherein B is selected from one or more identical or different groups of Formula (18)

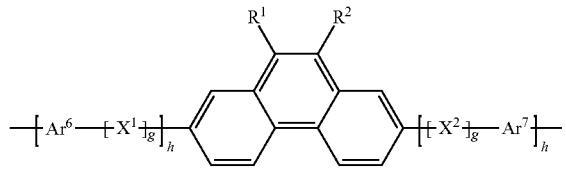

Formula (18)

wherein

R¹ and R² are independently of each other identical or different groups selected from H, halogen, —CN, —NC, —NCO, —NCS, —OCN, —SCN, —C(═O) NR⁰R⁰⁰, —C(═O)R⁰, —NH₂, —NR⁰R⁰⁰, —SH, —SR⁰—, SO₃H, —SO₂R⁰, —OH, —NO₂, —CF₃, —SF₅, optionally substituted silyl, or carbyl or hydrocarbyl with 1 to 40 C atoms that is optionally substituted and optionally comprises one or more hetero atoms, and optionally the groups R¹ and R² form a spiro group with the fluorene moiety to which they are attached, X is halogen, R⁰ and R⁰⁰ are independently of each other hydrogen, a substituted carbyl or hydrocarbyl group optionally comprising one or more hetero atoms, X¹ and X² are independently of each other —CR¹═CR¹—, —C≡C— or —N—Ar⁸—, Ar⁶⁻⁸ are in case of multiple occurrence independently of one another a bivalent aromatic or heteroaromatic ring system having from 2 to 40 C atoms, which is optionally substituted ᵇʸ one or more groups R¹, g is in each occurrence independently of one another 0 or 1, and h is in each occurrence independently of one another 0, 1 or 2.

13. The oligomer or polymer according to claim 1, wherein B is selected from one or more identical or different groups of Formula (24):

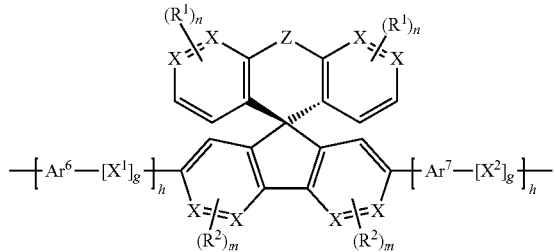

Formula (24)

wherein X¹ and X² are independently of each other —CR¹═CR¹—, —C≡C— or —N—Ar⁸—,

Ar⁶⁻⁷ are in case of multiple occurrence independently of one another a bivalent aromatic or heteroaromatic ring system having from 2 to 40 C atoms, which is optionally substituted ᵇʸ one or more groups R¹, g is in each occurrence independently of one another 0 or 1, and h is in each occurrence independently of one another 0, 1 or 2

X is in each occurrence independently of one another CH, CR¹ or N,

Z is in each occurrence independently of one another a single bond, $CR^5R^6$, $CR^5R^6—CR^5R^6$, $CR^5=CR^6$, O, S, $N—R^5$, $C=O$, $R^1—P=O$, $O=S=O$, $S=O$, $C=CR^5R^6$ or $SiR^5R^6$;

$R^1$ and $R^2$ are independently of each other identical or different groups selected from H, halogen, —CN, —NC, —NCO, —NCS, —OCN, —SCN, —C(=O)NR$^0$R$^{00}$, —C(=O)X', —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, and optionally the groups $R^1$ and $R^2$ form a spiro group with the fluorene moiety to which they are attached, X' is halogen, $R^0$ and $R^{00}$ are independently of each other hydrogen, a substituted carbyl or hydrocarbyl group optionally comprising one or more hetero atoms, $R^{5,6}$ have independently of each other one of the meanings of $R^1$, m is in each occurrence independently of one another 0, 1, 2, or 3, n is in each occurrence independently of one another 0, 1, 2, 3 or 4.

14. The oligomer or polymer according to claim 1, wherein $A^{em}$ is selected from one or more identical or different groups of Formula (96)

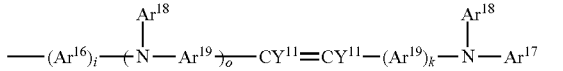

Formula (96)

wherein $Ar^{16}$ is in each occurrence independently of one another mono- or polycyclic aryl or heteroaryl, which is optionally substituted by one or more groups $R^{21}$, $Ar^{17}$ is in each occurrence independently of one another mono- or polycyclic aryl or heteroaryl, which is optionally substituted by one or more groups $R^{22}$, $Ar^{18}$ is in each occurrence independently of one another mono- or polycyclic aryl or heteroaryl, which is optionally substituted by one or more groups $R^{23}$, $Ar^{19}$ is in each occurrence independently of one another mono- or polycyclic aryl or heteroaryl, which is optionally substituted by one or more groups $R^{24}$, $Y^{11}$ is in case of multiple occurrence independently of one another selected from H, F, Cl or carbyl or hydrocarbyl with 1 to 40 C atoms that is optionally substituted and optionally consists of one or more hetero atoms, and optionally two groups $Y^{11}$, or a group $Y^{11}$ and an adjacent group $R^{21}$, $R^{24}$, $Ar^{11}$ or $A^{14}$, do together form an aromatic, mono- or polycyclic ring system, $R^{21-24}$ denote in case of multiple occurrence independently of one another H, halogen, —CN, —NC, —NCO, —NCS, —OCN, —SCN, —C(=O)NR$^0$R$^{00}$, —C(=O)X', —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, and wherein optionally two or more groups $R^{21-24}$ do together form an aliphatic or aromatic, mono- or polycyclic ring system; and wherein $R^{21}$, $R^{22}$ and $R^{23}$ may also denote a covalent bond in a polymer, $X^1$ is halogen, $R^0$ and $R^{00}$ are independently of each other hydrogen, a substituted carbyl or hydrocarbyl group optionally comprising one or more hetero atoms, i is in each occurrence independently of one another 1, 2 or 3, k is in each occurrence independently of one another 1, 2 or 3, o is in each occurrence independently of one another 0 or 1.

15. The oligomer or polymer according to claim 1, wherein $A^{em}$ is selected from one or more identical or different groups of Formula (108)

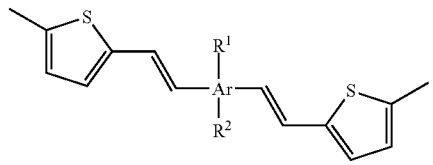

Formula (108)

wherein $R^1$ and $R^2$ are independently of each other identical or different groups selected from H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, and optionally the groups $R^1$ and $R^2$ form a spiro group with the fluorene moiety to which they are attached, X is halogen, $R^0$ and $R^{00}$ are independently of each other hydrogen, a substituted carbyl or hydrocarbyl group optionally comprising one or more hetero atoms, Ar has one of the meanings of $Ar^{11}$, and $Ar^{11}$ which may be the same or different, denote, independently if in different repeat units, a single bond or an optionally substituted mononuclear or polynuclear aryl group.

16. An electronic device comprising the oligomer or polymer according to claim 1.

17. The electronic according to claim 16, wherein the device comprises a conductive polymer layer and/or a hole transporting layer, and the organic compound is coated directly onto the conductive polymer and/or hole transport layer.

18. The electronic device according to claim 16, wherein the device is an organic light emitting diode (OLED), organic field effect transistor (OFET), thin film transistor (TFT), organic solar cell (O-SC), organic laser diode (O-laser), organic integrated circuit (O-IC), radio frequency identification (RFID) tag, photodetector, sensor, logic circuit, memory element, capacitor, charge injection layer, Schottky diode, planarising layer, antistatic film, conducting substrate or pattern, photoconductor, electrophotographic element, organic light emitting transistor (OLET), organic light emitting electrochemical transistor, organic plasmon emitting device or organic spintronic device.

19. The oligomer or polymer according to claim 1, wherein both $Ar^1$ and at least one $Ar^2$ has electron transport property, and wherein the difference between the LUMOs of the said at least one $Ar^2$ and the main chain is less than 0.1 eV and wherein both $Ar^1$ and at least one $Ar^2$ has hole transport property and wherein the difference between the LUMOs of the said at least one $Ar^2$ and the main chain isles than 0.1 eV.

20. The oligomer or polymer according to claim 1, wherein n1>each of n2, n3 and n4.

21. The oligomer or polymer according to claim 1, wherein n1+n2+n3+n4=1.

\* \* \* \* \*